United States Patent
Yamaguchi et al.

(10) Patent No.: US 8,471,365 B2
(45) Date of Patent: Jun. 25, 2013

(54) NITRIDE SEMICONDUCTOR SUBSTRATE, SEMICONDUCTOR DEVICE, AND METHODS FOR MANUFACTURING NITRIDE SEMICONDUCTOR SUBSTRATE AND SEMICONDUCTOR DEVICE

(75) Inventors: Sayuri Yamaguchi, Itami (JP); Naoki Matsumoto, Itami (JP); Hidenori Mikami, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 122 days.

(21) Appl. No.: 12/833,145

(22) Filed: Jul. 9, 2010

(65) Prior Publication Data

US 2011/0068434 A1     Mar. 24, 2011

(30) Foreign Application Priority Data

Sep. 24, 2009    (JP) ................................. 2009-218890

(51) Int. Cl.
*H01L 29/205*     (2006.01)

(52) U.S. Cl.
USPC .... 257/615; 257/613; 257/618; 257/E29.089; 257/E21.09; 438/47; 438/478; 438/492

(58) Field of Classification Search
USPC ............... 257/615, E29.089, 11.183, E21.09, 257/76, 79, 618, 496, 613; 438/478, 47, 492
See application file for complete search history.

(56) References Cited

U.S. PATENT DOCUMENTS

| | | | | |
|---|---|---|---|---|
| 6,756,246 | B2 * | 6/2004 | Hiramatsu et al. | 438/47 |
| 6,828,591 | B2 * | 12/2004 | Okuyama et al. | 257/89 |
| 2007/0221932 | A1 * | 9/2007 | Kano et al. | 257/96 |
| 2010/0224963 | A1 * | 9/2010 | Ishibashi et al. | 257/615 |
| 2010/0270649 | A1 * | 10/2010 | Ishibashi et al. | 257/615 |

FOREIGN PATENT DOCUMENTS

| | | |
|---|---|---|
| EP | 2246877 A1 | 11/2010 |
| JP | 2002-222746 A | 8/2002 |
| JP | 2004-319951 | 11/2004 |
| JP | 2008-060375 A | 3/2008 |
| JP | 4333820 | 7/2009 |
| WO | WO-2009/107567 A1 | 9/2009 |

* cited by examiner

*Primary Examiner* — Thinh T Nguyen
(74) *Attorney, Agent, or Firm* — Drinker Biddle & Reath LLP

(57) ABSTRACT

A nitride semiconductor substrate having a main surface serving as a semipolar plane and provided with a chamfered portion capable of effectively preventing cracking and chipping, a semiconductor device fabricated using the nitride semiconductor substrate, and a method for manufacturing the nitride semiconductor substrate and the semiconductor device are provided. The nitride semiconductor substrate includes a main surface inclined at an angle of 71° or more and 79° or less with respect to the (0001) plane toward the [1-100] direction or inclined at an angle of 71° or more and 79° or less with respect to the (000-1) plane toward the [-1100] direction; and a chamfered portion located at an edge of an outer periphery of the main surface. The chamfered portion is inclined at an angle θ1 or θ2 of 5° or more and 45° or less with respect to adjacent one of the main surface and a backside surface on a side opposite to the main surface. Accordingly, cracking and chipping occurring from the edge of the outer periphery of the nitride semiconductor substrate can be effectively suppressed.

5 Claims, 12 Drawing Sheets

NITRIDE SEMICONDUCTOR SUBSTRATE, SEMICONDUCTOR DEVICE, AND METHODS FOR MANUFACTURING NITRIDE SEMICONDUCTOR SUBSTRATE AND SEMICONDUCTOR DEVICE

BACKGROUND OF THE INVENTION

1. Field of the Invention

The present invention relates to a nitride semiconductor substrate, a semiconductor device and methods for manufacturing the nitride semiconductor substrate and the semiconductor device, and more particularly to a nitride semiconductor substrate having a main surface serving as a semipolar plane, a semiconductor device, and methods for manufacturing the nitride semiconductor substrate and the semiconductor device.

2. Description of the Background Art

A nitride semiconductor substrate such as a GaN substrate having an energy band gap of 3.4 eV and a high thermal conductivity has been attracting attention as material for a semiconductor device such as a power electronic device and an optical device of a short wavelength. In order to prevent chipping, cracking and the like of the substrate, it is proposed to provide a chamfered portion at the edge of the outer periphery in the GaN substrate which is an example of the above-described nitride semiconductor substrate (for example, see Japanese Patent Laying-Open No. 2004-319951).

However, Japanese Patent Laying-Open No. 2004-319951 as described above discloses a substrate having a main surface corresponding to the c-plane, but fails to disclose a nitride semiconductor substrate having a main surface serving as a semipolar plane (main surface inclined from the c-plane). Furthermore, it is not known what type of chamfered portion is formed at the edge of the outer periphery in the nitride semiconductor substrate conventionally having such a semipolar plane as a main surface in order to effectively reduce cracking and chipping of the nitride semiconductor substrate.

SUMMARY OF THE INVENTION

The present invention has been made in order to solve the above-described problems, and an object of the present invention is to provide a nitride semiconductor substrate having a main surface serving as a semipolar plane and provided with a chamfered portion capable of effectively preventing cracking and chipping; and a semiconductor device fabricated using the nitride semiconductor substrate, and methods for manufacturing the nitride semiconductor substrate and the semiconductor device.

The inventors of the present invention have made an earnest study to discover that the nitride semiconductor substrate capable of improving the oscillation yield when fabricating a semiconductor laser device has a main surface inclined at an angle of 71° or more and 79° or less with respect to the (0001) plane toward the [1-100] direction, or a main surface inclined at an angle of 71° or more and 79° or less with respect to the (000-1) plane toward the [-1100] direction. The inventors also discovered the shape of the chamfered portion capable of effectively suppressing cracking and chipping occurring in the nitride semiconductor substrate during the process of manufacturing the semiconductor device and during handling of the nitride semiconductor substrate by employing the nitride semiconductor substrate having the above-described main surface for the semiconductor device.

The nitride semiconductor substrate according to the present invention includes a main surface inclined at an angle of 71° or more and 79° or less with respect to a (0001) plane toward a [1-100] direction or inclined at an angle of 71° or more and 79° or less with respect to a (000-1) plane toward a [-1100] direction; and a chamfered portion located at an edge of an outer periphery of the main surface. The chamfered portion is inclined at an angle of 5° or more and 45° or less with respect to adjacent one of the main surface and a backside surface on a side opposite to the main surface.

The nitride semiconductor substrate according to the present invention has a main surface which allows the yield to be improved when a semiconductor device is fabricated. Furthermore, cracking and chipping occurring from the edge of the outer periphery in the nitride semiconductor substrate can also be suppressed. Consequently, defects occurring in the nitride semiconductor substrate resulting from the above-mentioned cracking and chipping can be suppressed, to allow an increase in the yield of the nitride semiconductor substrate.

A method for manufacturing a nitride semiconductor substrate according to the present invention includes the steps of: preparing a nitride semiconductor substrate having a main surface inclined at an angle of 71° or more and 79° or less with respect to a (0001) plane toward a [1-100] direction or inclined at an angle of 71° or more and 79° or less with respect to a (000-1) plane toward a [-1100] direction; and chamfering an edge of an outer periphery of the main surface of the nitride semiconductor substrate. The step of chamfering the edge includes the step of forming a chamfered portion inclined at an angle of 5° or more and 45° or less with respect to adjacent one of the main surface and a backside surface on a side opposite to the main surface.

In this way, the nitride semiconductor substrate according to the present invention can be manufactured.

The semiconductor device according to the present invention is a semiconductor device fabricated using the above-described nitride semiconductor substrate. In this case, since cracking and chipping of the nitride semiconductor substrate can be effectively suppressed, a semiconductor device providing a high manufacturing yield can be implemented.

The method for manufacturing a semiconductor device according to the present invention includes the steps of preparing a nitride semiconductor substrate using the above-described method for manufacturing the nitride semiconductor substrate; and forming an epitaxial layer on the main surface of the nitride semiconductor substrate. In this case, since cracking and chipping of the nitride semiconductor substrate can be effectively suppressed, a semiconductor device providing a high manufacturing yield can be implemented.

According to the present invention, cracking and chipping of the nitride semiconductor substrate can be effectively suppressed, with the result that a semiconductor device providing a high yield can be manufactured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
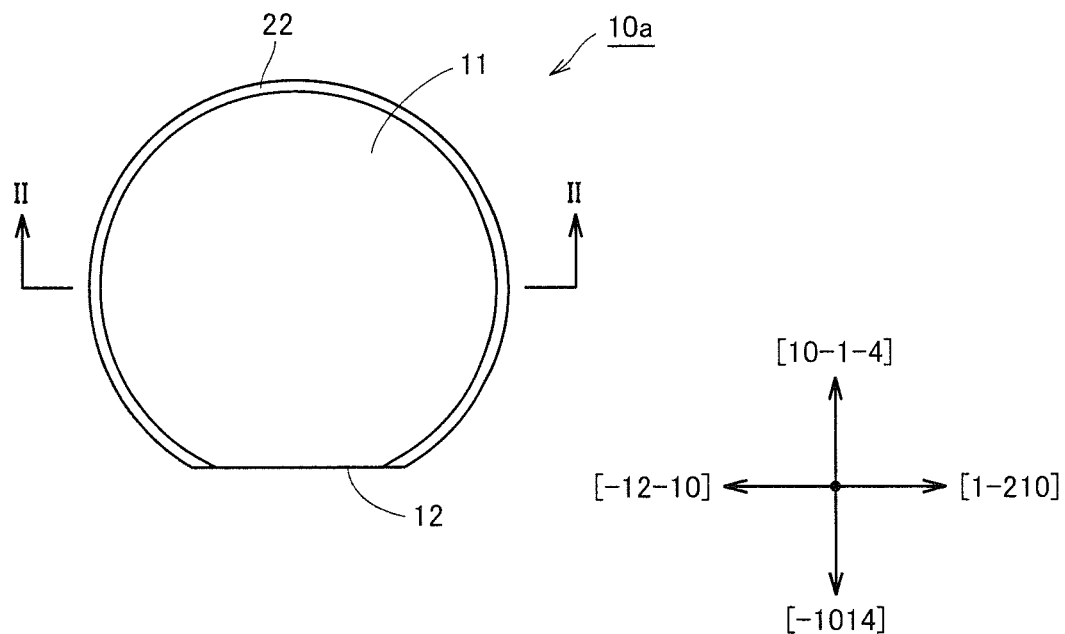
FIG. 1 is a schematic plan view of the first embodiment of a nitride semiconductor substrate according to the present invention.

The embodiments of the present invention will be hereinafter described with reference to the accompanying drawings, in which the same or corresponding components are designated by the same reference characters, and description thereof will not be repeated. In addition, in this specification, each orientation is represented in square brackets "[ ]" and each plane is represented in round brackets "( )". Although a negative index should be crystallographically represented to have a negative sign (a bar ("–")) attached on the figure, the negative sign ("–") is placed in front of the figure in this specification. It goes without saying that the specific orientation and direction in the description also include the orientation and direction having the relationship equivalent thereto.

First Embodiment

Figure 2:
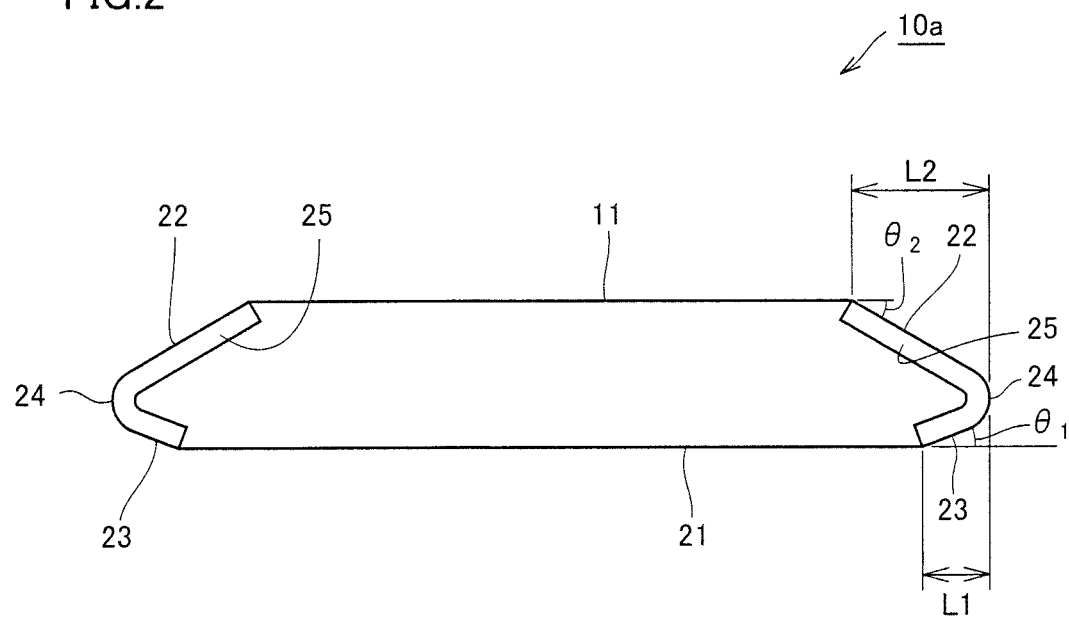
FIG. 2 is a schematic cross-sectional view taken along a line II-II in FIG. 1.
Figure 3:
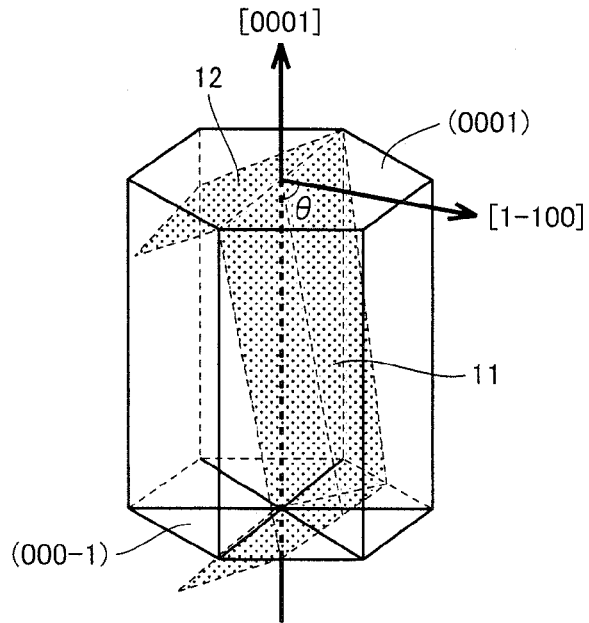
FIG. 3 is a schematic diagram illustrating the plane orientation of each of the main surface and the orientation flat of the nitride semiconductor substrate shown in FIGS. 1 and 2.

Referring to FIGS. 1-3, the first embodiment of the nitride semiconductor substrate according to the present invention will be hereinafter described.

As shown in FIGS. 1 and 2, a nitride semiconductor substrate 10a according to the present invention has an approximately circular shape as seen in plan view and has an orientation flat 12 formed by linearly processing a part of the edge of the outer periphery. Furthermore, on the edge of the outer periphery of nitride semiconductor substrate 10a, a topside chamfer 22 is formed which corresponds to a chamfered portion located on the main surface 11 side. Furthermore, on the outer periphery of a backside surface 21 on the side opposite to main surface 11, a backside chamfer 23 is formed which corresponds to a chamfered portion located on the backside surface 21 side. At the edge of the outer periphery of nitride semiconductor substrate 10a, an edge face 24 having a curved surface is formed so as to connect topside chamfer 22 and backside chamfer 23. These topside chamfer 22, backside chamfer 23 and edge face 24 constitute a chamfered portion (chamfer). Topside chamfer 22 has a width L2 greater than a width L1 of backside chamfer 23.

Topside chamfer 22 extends in the direction intersecting at an angle θ2 with the direction in which main surface 11 extends. Furthermore, backside chamfer 23 extends in the direction intersecting at an angle θ1 with the direction in which backside surface 21 extends. Angles θ1 and θ2 may be the same value or a different value. A damaged layer 25 is formed on the surface layer of each of topside chamfer 22, backside chamfer 23 and edge face 24. As seen from FIG. 2, damaged layer 25 formed in topside chamfer 22 has a thickness greater than that of damaged layer 25 formed in backside chamfer 23.

Main surface 11 corresponds to a plane inclined at an angle of 71° or more and 79° or less with respect to the (0001) plane (c+ plane) toward the [1-100] direction (m+ axis direction) or a plane inclined at an angle of 71° or more and 79° or less with respect to the (000-1) plane (c– plane) toward the [–1100] direction (m– axis direction), and preferably corresponds to the (20-21) plane or the (–202-1) plane. It is to be noted that the plane orientation of main surface 11 may be inclined at a predetermined angle from the above-described plane orientation (20-21) or (–202-1).

The plane orientation of main surface 11 will be hereinafter described with reference to FIG. 3. As shown in FIG. 3, main surface 11 is inclined at an angle θ with respect to the (0001) plane toward the [1-100] direction (m+axis direction). In other words, main surface 11 is inclined at angle θ with respect to the [0001] direction (c-axis direction) toward the [1-100] direction (m– axis direction). Angle θ is 71° or more and 79° or less, preferably 73° or more and 77° or less, and more preferably 74° or more and 76° or less. It is to be noted that the (20-21) plane or the (–202-1) plane is inclined at an angle of approximately 75° (=angle θ) with respect to the (0001) plane or the (000-1) plane toward the m+ axis direction or the m– axis direction. The m– axis direction herein corresponds to the [–1100] direction.

Furthermore, when the above-described angle θ is 71° or more and 79° or less, the yield of the semiconductor device (for example, a semiconductor laser device) fabricated using this nitride semiconductor substrate 10a can be improved (for example, 50% or more). When angle θ is 73° or more and 77°
or less, the yield of the semiconductor device (for example, a semiconductor laser device) fabricated using nitride semiconductor substrate 10a can be further improved (for example, 75% or more). When angle θ is 74° or more and 76° or less, the yield of the semiconductor device (for example, a semiconductor laser device) fabricated using nitride semiconductor substrate 10a can be still further improved (for example, 80% or more).

Furthermore, in nitride semiconductor substrate 10a as described above, the chamfered portion is inclined at an angle of 5° or more and 45° or less with respect to one, which is adjacent to the chamfered portion, of main surface 11 and backside surface 21 on the side opposite to main surface 11 (angle θ1 or angle θ2 in FIG. 2). In this way, cracking and chipping occurring from the edge of the outer periphery of nitride semiconductor substrate 10a can be suppressed. Consequently, defects occurring in nitride semiconductor substrate 10a resulting from the above-mentioned cracking and chipping can be suppressed, to thereby allow the processing yield of nitride semiconductor substrate 10a to be improved. Furthermore, the yield of the semiconductor device (for example, a semiconductor laser device) fabricated using nitride semiconductor substrate 10a can be improved.

Also, as shown in FIGS. 1 and 2, since the size of each of topside chamfer 22 and backside chamfer 23 in the chamfered portion (for example, width L1 and width L2 each corresponding to the chamfering amount) is different between main surface 11 and backside surface 21, main surface 11 and backside surface 21 can be distinguished from each other by visually examining the size of each chamfer.

Furthermore, in the chamfered portion, the thickness of damaged layer 25 on the main surface 11 side corresponding to the topside surface is different from the thickness of damaged layer 25 on the backside surface 21 side. Accordingly, the stability of the shape of nitride semiconductor substrate 10a can be improved.

Furthermore, referring to FIG. 1, orientation flat 12 is obtained by cutting out a part of the outer periphery of nitride semiconductor substrate 10a in an arcuate shape in order to show the crystal orientation of nitride semiconductor substrate 10a. In other words, orientation flat 12 corresponds to a linear area formed in a part of the circle of main surface 11 as seen from above. It is to be noted that the inventors first found that, when the main surface corresponds to the (20-21) plane inclined at an angle of 75° with respect to the (0001) plane toward the [1-100] direction or the (-202-1) plane inclined at an angle of 75° with respect to the (000-1) plane toward the [-1100] direction, cleavage readily occurs at and near the (-1017) plane or the (10-1-7) plane approximately orthogonal to the main surface. Thus, orientation flat 12 corresponds to the (-1017) plane, the (10-1-7) plane or the plane inclined at angle of -0.5° or more and 0.5° or less from these planes, more preferably corresponds to the (-1017) plane, the (10-1-7) plane or the plane inclined at an angle of -0.2° or more and 0.2° or less from these planes, and most preferably corresponds to the (-1017) plane or the (10-1-7) plane.

The plane orientation of orientation flat 12 will be hereinafter described with reference to FIG. 3. As shown in FIG. 3, orientation flat 12 is at and near the (-1017) plane or the (10-1-7) plane. The (-1017) plane and the (10-1-7) plane are approximately orthogonal to the (20-21) plane or the (-202-1) plane (intersected at an angle of 90.10°). Accordingly, orientation flat 12 is approximately orthogonal to main surface 11. These (-1017) plane and (10-1-7) plane each are different from the conventional cleavage plane such as the conventional c-plane, m-plane or a-plane.

The direction of the normal to the (-1017) plane or the (10-1-7) plane extends approximately in the [-1014] direction or the [10-1-4] direction.

Therefore, it has been found for the first time that orientation flat 12 can be readily formed in the plane orthogonal to the [-1014] direction corresponding to the direction of the normal to the (-1017) plane when the main surface is inclined at an angle of 71° or more and 79° or less with respect to the (0001) plane toward the [1-100] direction, or in the plane orthogonal to the [10-1-4] direction corresponding to the direction of the normal to the (10-1-7) plane when the main surface is inclined at an angle of 71° or more and 79° or less with respect to the (000-1) plane toward the [-1100] direction.

Furthermore, the present inventors have made an earnest study to find out that, from a different point of view, the (-1017) plane, the (10-1-7) plane, or the plane inclined at an angle of -0.5° or more and 0.5° or less from these planes has a tendency to easily cleave. Accordingly, orientation flat 12 can be readily formed in the plane as described above. Furthermore, orientation flat 12 can be readily formed in the (-1017) plane, the (10-1-7) plane, or the plane inclined at an angle of -0.2° or more and 0.2° or less from these planes. In addition, orientation flat 12 may be formed in the (-1017) plane or the (10-1-7) plane.

It is to be noted that the c+ plane represents the (0001) plane having a Ga polarity, and the c− plane represents the (000-1) plane having an N polarity. The m− axis direction includes the [1-100] direction, the [10-10] direction, the [-1100] direction, the [-1010] direction, the [01-10] direction, the [0-110] direction, and the direction parallel to these directions.

Furthermore, the (-1017) plane lies on the side opposite to the (10-1-7) plane.

Nitride semiconductor substrate 10a is, for example, $Al_xIn_yGa_{(1-x-y)}N$ ($0 \leq x \leq 1$, $0 \leq y \leq 1$, $x+y \leq 1$), preferably $Al_xGa_{(1-x)}N$ ($0 \leq x \leq 1$), and more preferably GaN. Furthermore, when the nitride semiconductor substrate is in the shape of a circle, the diameter is preferably 10 mm or more, more preferably 30 mm or more, further preferably 2 inches or more, and still further preferably 3 inches or more. Also, when the nitride semiconductor substrate has a quadrangular shape, the side length is preferably 10 mm or more, more preferably 18 mm or more, and further preferably 30 mm or more. It is preferable that the substrate has a thickness of 100 µm or more and 1000 µm or less. The substrate can be handled when the thickness is 100 µm or more, and can be cut when the thickness is 1000 µm or less. It is more preferable that the thickness is 300 µm or more and 400 µm or less.

Figure 4:
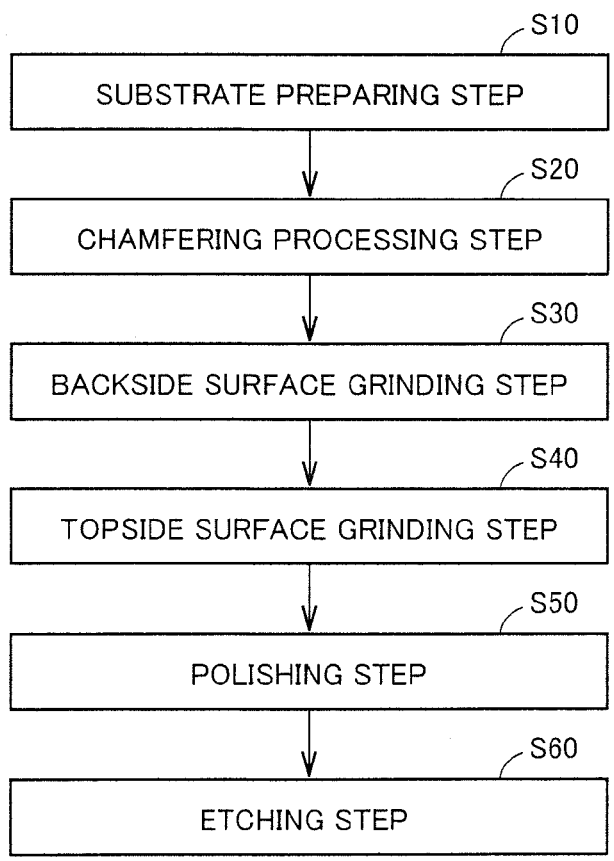
FIG. 4 is a flowchart illustrating a method for manufacturing the nitride semiconductor substrate shown in FIGS. 1 and 2.

Referring to FIG. 4, the method for manufacturing the nitride semiconductor substrate shown in FIGS. 1 and 2 will be described.

Referring to FIG. 4, the substrate preparing step (S10) is first carried out. Specifically, in the step (S10), a nitride semiconductor substrate fabricated, for example, by the vapor deposition method is prepared. Although the nitride semiconductor substrate can have an arbitrary planar shape, it may have a circular shape, for example. Furthermore, the nitride semiconductor substrate having a circular shape may have a diameter of 2 inches (approximately 50 mm), for example. The nitride semiconductor substrate can be configured to contain dopants to be rendered an arbitrary conductivity type (for example, an n-type). For example, silicon (Si) and oxygen (O) can be applied as dopants that are used for the substrate to be rendered n-type conductivity.

In this step (S10), it is possible to carry out the process step for setting the outer diameter of the ingot of the nitride semiconductor grown, for example, by the vapor deposition method to a predetermined value (for example, outer-periphery grinding step and core-drilling step), and the step of obtaining a wafer by slicing the processed ingot.

It is to be noted that the nitride semiconductor substrate prepared in this step (S10) may be manufactured by an arbitrary method. For example, the nitride semiconductor substrate manufactured by the following method may be prepared.

An underlying substrate is prepared. The underlying substrate to be prepared may be made of the material identical to or different from that of nitride semiconductor substrate 10a to be grown. As the above-described underlying substrate, for example, a GaN substrate, a gallium arsenide (GaAs) substrate, a sapphire ($Al_2O_3$) substrate, a zinc oxide (ZnO) substrate, a silicon carbide (SiC) substrate, and the like can be used.

Then, a nitride semiconductor crystal is formed on the underlying substrate. The method for growing a nitride semiconductor crystal is not particularly limited, but may include the vapor deposition method such as the sublimation method, the HVPE (hydride vapor phase epitaxy) method, the MOCVD (metal organic chemical vapor deposition) method, and the MBE (molecular beam epitaxy) method; and the liquid phase growth method such as the flux method and the ammonothermal method.

Then, a nitride semiconductor substrate is cut out from the nitride semiconductor crystal processed to achieve an outer diameter having a predetermined value. In this case, the nitride semiconductor substrate is cut out such that the main surface is inclined at an angle of 71° or more and 79° or less with respect to the (0001) plane toward the [1-100] direction. For example, when the main surface of the underlying substrate corresponds to the c+ plane, the nitride semiconductor crystal grows in the c+ axis direction. For this reason, the nitride semiconductor substrate is cut out along the flat plane parallel to main surface 11 in FIG. 3 (the plane inclined at angle θ with respect to the c+plane toward the m+ axis direction). When the nitride semiconductor substrate is cut out such that the main surface is inclined at an angle of 71° or more and 79° or less with respect to the (000-1) plane toward the [-1100] direction, the (0001) plane is on the side opposite to the (000-1) plane, and accordingly, the bottom of the above-mentioned crystal corresponds to the (000-1) plane. Therefore, it is only necessary to cut out the nitride semiconductor substrate such that the main surface is inclined at an angle of 71° or more and 79° or less with respect to that plane toward the [-1100] direction.

The method for cutting out the nitride semiconductor substrate is not particularly limited, and, for example, a mechanical removal method such as cutting may be employed. Cutting means that a slicer provided with an outer peripheral blade, a slicer provided with an inner peripheral blade, a wire saw or the like is used to mechanically cut out nitride semiconductor substrate 10a from the nitride semiconductor crystal.

It is to be noted that the underlying substrate may be removed, if necessary. Although the method for removing the underlying substrate is not particularly limited, for example, a method such as cutting, grinding and the like can be employed. Cutting means that a slicer provided with an outer peripheral blade made of an electrodeposited diamond wheel, a wire saw or the like is used to mechanically cut (slice) the interface between the nitride semiconductor crystal and the underlying substrate; to apply or spray a laser pulse or water molecules on the interface between the nitride semiconductor crystal and the underlying substrate; to cause cleavage along the crystal lattice plane; and to mechanically cut apart the nitride semiconductor crystal and the underlying substrate by the chemical method such as etching. Furthermore, grinding means that a grindstone is rotated to be brought into contact with the surface of the underlying substrate for scraping in the thickness direction. In order to remove the underlying substrate by grinding, the underlying substrate is mechanically scraped off, for example, by the grinding apparatus provided with a diamond grindstone, and the like.

The process of fabricating a nitride semiconductor substrate having a main surface inclined at an angle of 71° or more and 79° or less with respect to the (0001) plane toward the [1-100] direction or inclined at an angle of 71° or more and 79° or less with respect to the (000-1) plane toward the [-1100] direction is not limited to the process of cutting out the nitride semiconductor substrate at a desired angle from the nitride semiconductor crystal grown in the c-axis direction. Furthermore, a nitride semiconductor substrate can also be manufactured by further growing a nitride semiconductor crystal on the main surface of the nitride semiconductor substrate obtained as described above, cutting out the grown nitride semiconductor crystal along the plane parallel to the main surface of the crystal substrate to produce a nitride semiconductor substrate, and processing the main surface of the nitride semiconductor substrate in the same manner as described above. The number of nitride semiconductor substrates used as an underlying substrate for further growing (repeatedly growing) the above-mentioned nitride semiconductor crystal is not necessarily limited to one, but a plurality of crystal substrates of small size may be used. The substrates can be joined together during the repeated growth to fabricate a single crystal. Furthermore, the crystal substrate cut out from the nitride semiconductor crystal joined during the repeated growth may also be used as an underlying substrate for another repeated growth. Thus, the production costs can be reduced by repeatedly using and growing the nitride semiconductor crystal.

Then, as shown in FIG. 4, the chamfering processing step (S20) is carried out. In this step (S20), a chamfer (chamfered portion) as shown in FIG. 2 is formed at the edge of the outer periphery of nitride semiconductor substrate 10a. Specifically, for example, a rubber grindstone 30 as shown in FIGS. 5 and 6 is used to process the edge of the outer periphery of nitride semiconductor substrate 10a.

Figure 5:
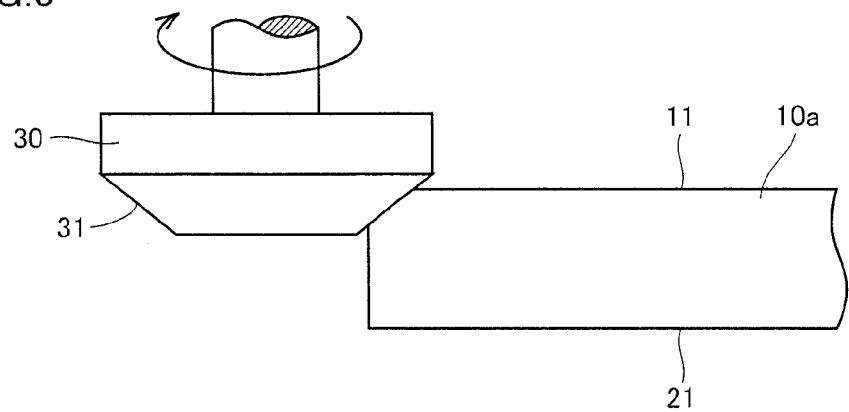
FIGS. 5 and 6 are schematic diagrams each illustrating a chamfering processing step (S20) shown in FIG. 4.
Figure 6:
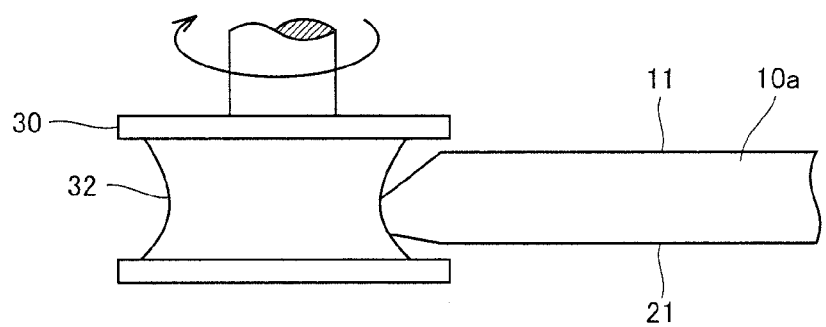

For example, as shown in FIG. 5, rubber grindstone 30 having a surface 31 in the conical shape is used to grind the angular portion of the edge of the outer periphery of nitride semiconductor substrate 10a. In this case, the area where surface 31 of rubber grindstone 30 is in contact with the edge of nitride semiconductor substrate 10a is linearly formed. As a result, topside chamfer 22 shown in FIG. 2 is formed. Also, rubber grindstone 30 shown in FIG. 5 is rotated, as shown by an arrow in FIG. 5, about the axis connected to rubber grindstone 30. Furthermore, angle θ2 formed between the direction in which main surface 11 shown in FIG. 2 extends and the direction in which topside chamfer 22 extends can be arbitrarily changed by adjusting the angle formed between surface 31 of rubber grindstone 30 and main surface 11 of nitride semiconductor substrate 10a.

Furthermore, backside chamfer 23 shown in FIG. 2 can be formed by bringing rubber grindstone 30 shown in FIG. 5 into contact with the edge of nitride semiconductor substrate 10a from the backside surface 21 side and grinding the edge.

Furthermore, edge face 24 having a curved surface shown in FIG. 2 is obtained by bringing rubber grindstone 30 having a surface 32 formed in a curved shape into contact with the edge face of nitride semiconductor substrate 10a and grinding the edge face. Although the conditions such as the grain size of rubber grindstone 30 as described above can be selected as appropriate, rubber grindstone 30 having a grain size, for example, of #300 to #3000 may be used.

In this chamfering processing step (S20), a microscope is used to detect the difference of the surface conditions between main surface 11 and backside surface 21 of nitride semiconductor substrate 10a for distinguishing between the topside surface and the backside surface. Then, in this step (S20), the processing amount in each of topside chamfer 22 and backside chamfer 23 is changed (for example, each chamfering amount and angles θ1 and θ2 are changed) to allow the topside surface and the backside surface of the substrate to be readily distinguished from each other in the subsequent steps.

Then, the backside surface grinding step (S30) is carried out. In this step (S30), backside surface 21 of nitride semiconductor substrate 10a is ground. In the grinding process, the conventionally well-known arbitrary methods can be employed. This step (S30) aims to form nitride semiconductor substrate 10a to have a thickness of a predetermined value.

It is to be noted that the backside surface etching step may be carried out after this step (S30) and before the topside surface grinding step (S40) described below. In this backside surface etching step, wet etching may be carried out, for example, using KOH as an etching solution. This is carried out in order to remove the damaged layer (for example, having a thickness of 1-30 μm) formed on the backside surface of the substrate in the step (S30) described above. Accordingly, the etching amount is selected as appropriate in accordance with the thickness of the damaged layer. For example, the etching amount can be set at 1 μm or more and 30 μm or less.

Then, the topside surface grinding step (S40) is carried out. Specifically, in this step (S40), main surface 11 corresponding to the topside surface of nitride semiconductor substrate 10a is subjected to the grinding process. This grinding process is carried out as a pre-process of the polishing step described below. It is to be noted that the conventionally well-known arbitrary method can be employed in this topside surface grinding step (S40). Furthermore, the thickness of the damaged layer formed in this grinding step is, for example, 0.5 μm or more and 20 μm or less.

Then, the polishing step (S50) is carried out. In this step (S50), main surface 11 is ground by an arbitrary method. Consequently, main surface 11 can be brought into a mirror-surface state. For example, in the polishing step (S50), rough polishing and finish polishing may be carried out. This results in formation of a damaged layer on and around main surface 11 (topside surface). The thickness of the damaged layer may be 0.1 μm or more and 5 μm or less, though varying depending on the conditions.

Then, the etching step (S60) is carried out. In this step (S60), at least a part of the damaged layer in each of main surface 11 and the chamfered portion of nitride semiconductor substrate 10a is removed by etching. An arbitrary method can be used as an etching method, and, for example, dry etching may be used. For example, in this step (S60), while the damaged layer of main surface 11 is completely removed, the damaged layer in the peripheral portion corresponding to the chamfered portion may be remained to have a thickness of 1 μm or more and 3 μm or less. It is to be noted that this etching step (S60) is not necessarily carried out. It is preferable that the roughness of the main surface of the nitride semiconductor substrate is 10 nm or less in terms of Ra standards. It is preferable that the roughness of the backside surface is 10 μm or less in terms of Ra standards.

It is to be noted that the step of forming orientation flat 12 may be carried out before or after the step (S20). Specifically, although the method for forming orientation flat 12 is not particularly limited, the nitride semiconductor substrate is subjected, for example, to cutting, grinding and the like in order to expose the (–1017) plane, the (10-1-7) plane, or the plane inclined at an angle of –0.5° or more and 0.5° or less from these planes.

Consequently, nitride semiconductor substrate 10a shown in FIGS. 1 and 2 can be obtained.

Referring to FIGS. 7-11, the modification of the nitride semiconductor substrate shown in FIGS. 1 and 2 will then be described.

Figure 7:
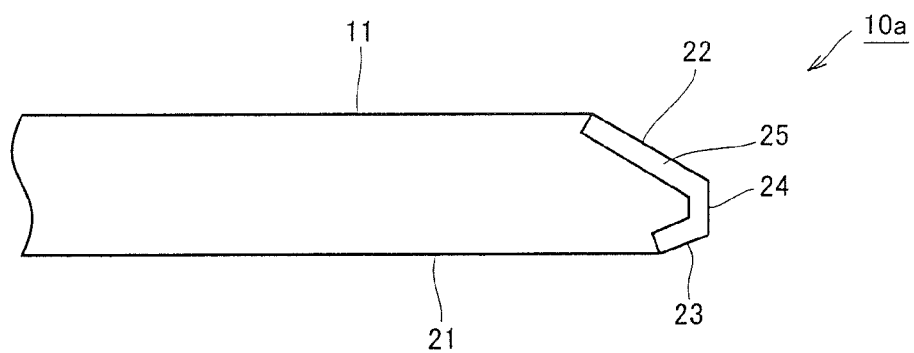
FIG. 7 is a partial cross-sectional schematic diagram showing a modification of the nitride semiconductor substrate shown in FIGS. 1 and 2.

Referring to FIG. 7, the modification of nitride semiconductor substrate 10a shown in FIGS. 1 and 2 is basically similar in structure to nitride semiconductor substrate 10a shown in FIGS. 1 and 2, but is different in shape of edge face 24. In other words, nitride semiconductor substrate 10a shown in FIG. 7 is provided with edge face 24 having a linear cross section as shown in FIG. 7. The substrate having such a configuration also allows the effects similar to those of nitride semiconductor substrate 10a shown in FIGS. 1 and 2 to be obtained.

Figure 8:
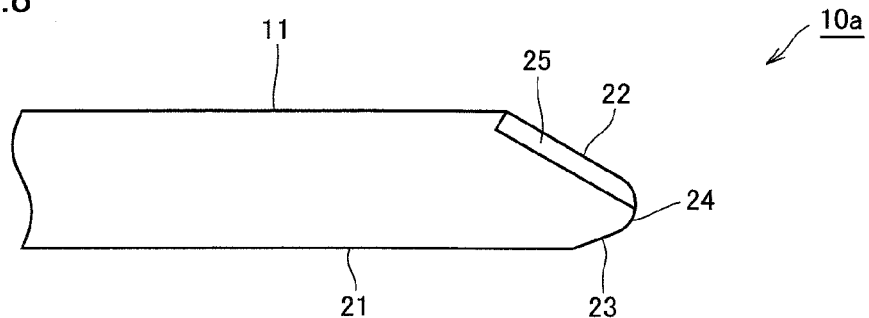
FIGS. 8 to 11 are partial cross-sectional schematic diagrams each showing a modification of the nitride semiconductor substrate shown in FIGS. 1 and 2.

Referring to FIG. 8, another modification of nitride semiconductor substrate 10a shown in FIGS. 1 and 2 is basically similar in structure to nitride semiconductor substrate 10a shown in FIGS. 1 and 2, but is different in shape of damaged layer 25 in the chamfered portion. In other words, in nitride semiconductor substrate 10a shown in FIG. 8, damaged layer 25 is formed only in topside chamfer 22. The substrate of such a configuration also allows the effects similar to those of nitride semiconductor substrate 10a shown in FIGS. 1 and 2 to be obtained.

Figure 9:
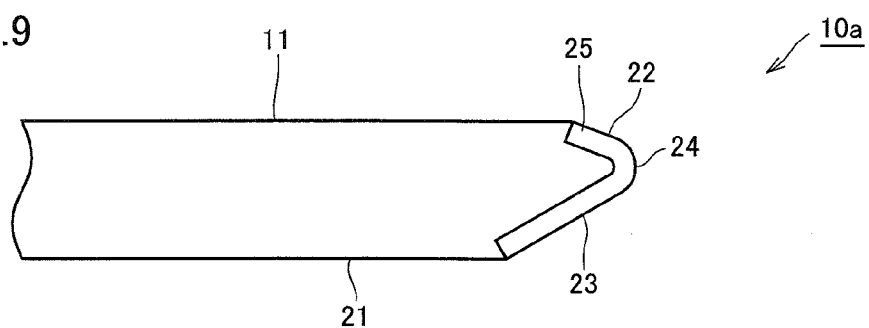

Nitride semiconductor substrate 10a shown in FIG. 9 is basically similar in structure to nitride semiconductor substrate 10a shown in FIGS. 1 and 2, but is different in shape of the chamfered portion. In other words, in nitride semiconductor substrate 10a shown in FIG. 9, the width of backside chamfer 23 (the chamfering amount) is greater than the width of topside chamfer 22 (the chamfering amount) forming a chamfered portion. The substrate of the above-described configuration also allows the effects similar to those of nitride semiconductor substrate 10a shown in FIGS. 1 and 2 to be obtained.

Figure 10:
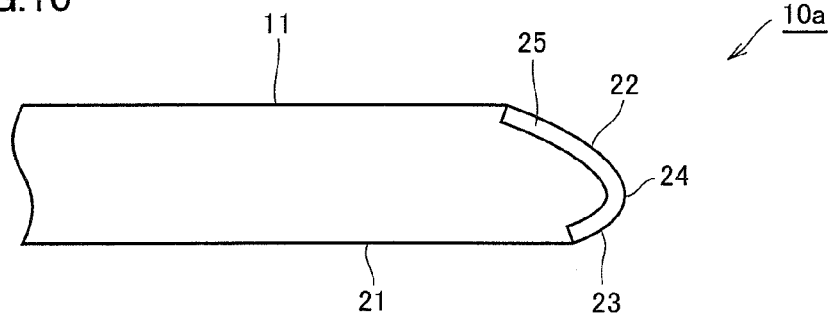

Nitride semiconductor substrate 10a shown in FIG. 10 is another modification of nitride semiconductor substrate 10a shown in FIGS. 1 and 2, but is different in shape of the chamfered portion from nitride semiconductor substrate 10a shown in FIGS. 1 and 2. In other words, in nitride semiconductor substrate 10a shown in FIG. 10, the contour of the cross section of each of topside chamfer 22, backside chamfer 23 and edge face 24 constituting a chamfered portion has a curved shape. The substrate of the above-described configuration also allows the effects similar to those of nitride semiconductor substrate 10a shown in FIGS. 1 and 2 to be obtained.

Figure 11:
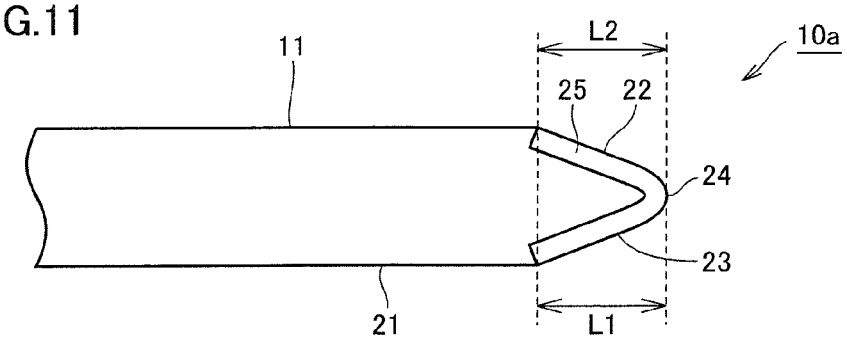

Nitride semiconductor substrate 10a shown in FIG. 11 is basically similar in configuration to nitride semiconductor substrate 10a shown in FIGS. 1 and 2, but is different in shape of the chamfered portion from nitride semiconductor substrate 10a shown in FIGS. 1 and 2. In other words, in nitride semiconductor substrate 10a shown in FIG. 11, topside chamfer 22 and backside chamfer 23 are almost equal in width. The substrate of the above-described configuration also allows the effects similar to those of nitride semiconductor substrate 10a shown in FIG. 1 to be obtained, for example, such as prevention of cracking and chipping occurring from the edge of the substrate. Furthermore, when topside chamfer 22 and backside chamfer 23 are almost equal in width, the warpage of the nitride semiconductor substrate can be reduced.

Figure 12:
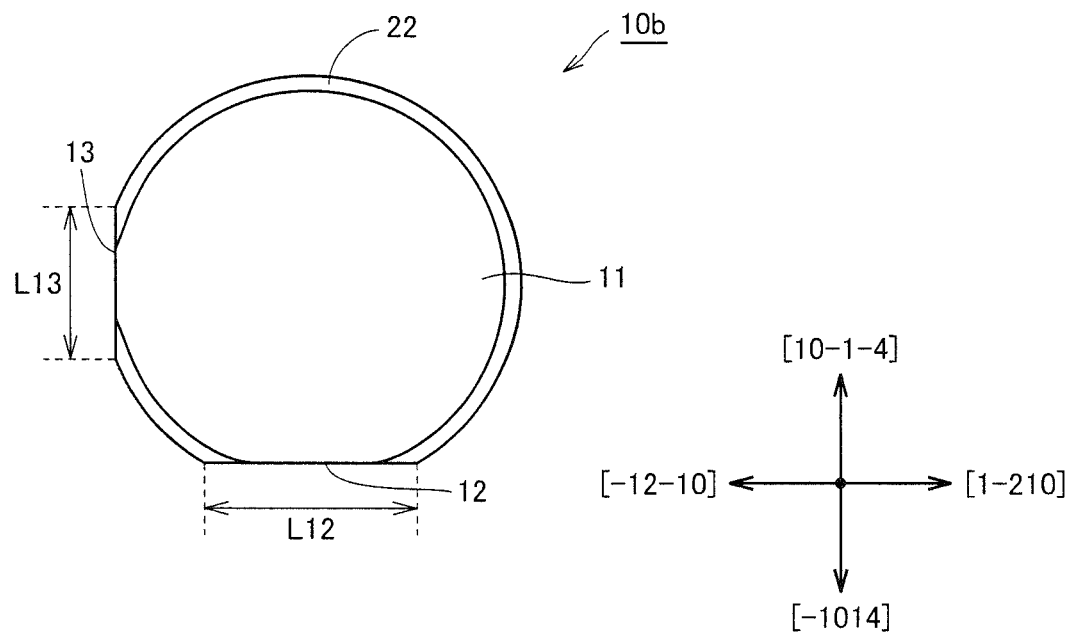
FIG. 12 is a schematic plan view showing another modification of the nitride semiconductor substrate shown in FIGS. 1 and 2.
Figure 13:
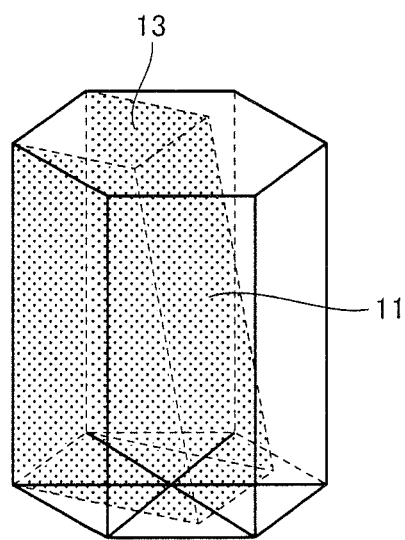
FIG. 13 is a schematic diagram illustrating the crystal orientation of the main surface and the second orientation flat of the nitride semiconductor substrate shown in FIG. 12.

Referring to FIGS. 12 and 13, another modification of the nitride semiconductor substrate shown in FIGS. 1 and 2 will be described.

A nitride semiconductor substrate 10b shown in FIG. 12 is basically similar in configuration to nitride semiconductor substrate 10a shown in FIGS. 1 and 2, but is different from nitride semiconductor substrate 10a in that nitride semiconductor substrate 10b further includes a second orientation flat 13.

Second orientation flat 13 serves as an IF (identification flat) or a sub-orientation flat for providing an indication of an orientation and for distinguishing between the topside surface and the backside surface. Second orientation flat 13 is approximately orthogonal to orientation flat 12. Second orientation flat 13 corresponds to the (11-20) plane (a-plane) or the plane inclined at an angle of −0.5° or more and 0.5° or less from this plane, and more preferably, corresponds to the (11-20) plane.

Referring to FIG. 13, the plane orientation of second orientation flat 13 will be hereinafter described. As shown in FIG. 13, second orientation flat 13 is at or near the (11-20) plane. The (11-20) plane is approximately orthogonal to the (20-21) plane or the (−202-1) plane, and also approximately orthogonal to the (−1017) plane or the (10-1-7) plane.

Second orientation flat 13 also allows the (11-20) plane or the plane inclined at an angle of −0.5° or more and 0.5° or less from this plane to be specified. It also allows the topside surface and the backside surface of nitride semiconductor substrate 10b to be readily distinguished from each other. Furthermore, cleavage readily occurs at and near the (11-20) plane where second orientation flat 13 can therefore readily be provided. In the case where second orientation flat 13 is at or near the (11-20) plane, the yield of the semiconductor device can be further improved.

It is to be noted that the a-plane as described above includes and is equivalent to the (11-20) plane, the (1-210) plane, the (−2110) plane, the (−1-120) plane, the (−12-10) plane, the (2-1-10) plane, and the plane parallel to these planes. Furthermore, the [1-210] direction and the [−12-10] direction in FIG. 3 extend in the a-axis direction. The a-axis direction includes the [11-20] direction, the [1-210] direction, the [−2110] direction, the [−1-120] direction, the [−12-10] direction, the [2-1-10] direction, and the direction parallel to these directions.

It is preferable that a length L12 of orientation flat 12 is different from a length L13 of second orientation flat 13. It is more preferable that these lengths are different enough to allow the difference between the lengths to be visually distinguished. Giving an example of the size of each of orientation flat 12 and second orientation flat 13, when the diameter of main surface 11 of nitride semiconductor substrate 10b is, for example, 50 mm, orientation flat 12 has length L12 of, for example, 2 mm or more and 30 mm or less, and second orientation flat 13 has length L13 shorter than length L12 and of 2 mm or more and 20 mm or less, for example.

It is to be noted that the relative relationship between length L12 of orientation flat 12 and length L13 of second orientation flat 13 is not taken into consideration.

As shown in FIG. 12, lengths L12 and L13 of orientation flat 12 and second orientation flat 13, respectively, correspond to each length of the linear areas in nitride semiconductor substrate 10b as seen from above.

The method for manufacturing the nitride semiconductor substrate shown in FIG. 12 is basically similar in configuration to the method for manufacturing the nitride semiconductor substrate shown in FIGS. 1 and 2, but is different in that it further includes the step of forming second orientation flat 13. Specifically, second orientation flat 13 corresponding to the (11-20) plane or the plane inclined at an angle of −0.5° or more and 0.5° or less from this plane is formed before, after or at the same time as formation of orientation flat 12.

As described above, nitride semiconductor substrate 10b according to the present embodiment further includes second orientation flat 13 corresponding to the (11-20) plane or the plane inclined at an angle of −0.5° or more and 0.5° or less from this plane.

Cleavage tends to occur in the plane (11-20) or the plane inclined at an angle of −0.5° or more and 0.5° or less from this plane, where second orientation flat 13 can therefore readily be formed. This also allows the topside surface and the backside surface of nitride semiconductor substrate 10b to be distinguished from each other.

Figure 14:
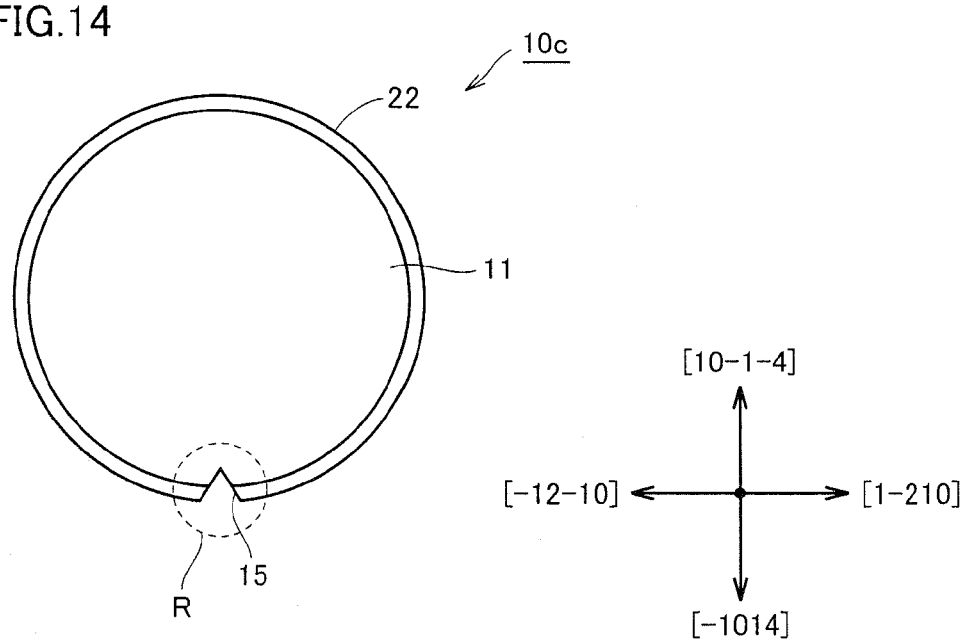
FIG. 14 is a schematic plan view illustrating another modification of the nitride semiconductor substrate shown in FIGS. 1 and 2.
Figure 15:
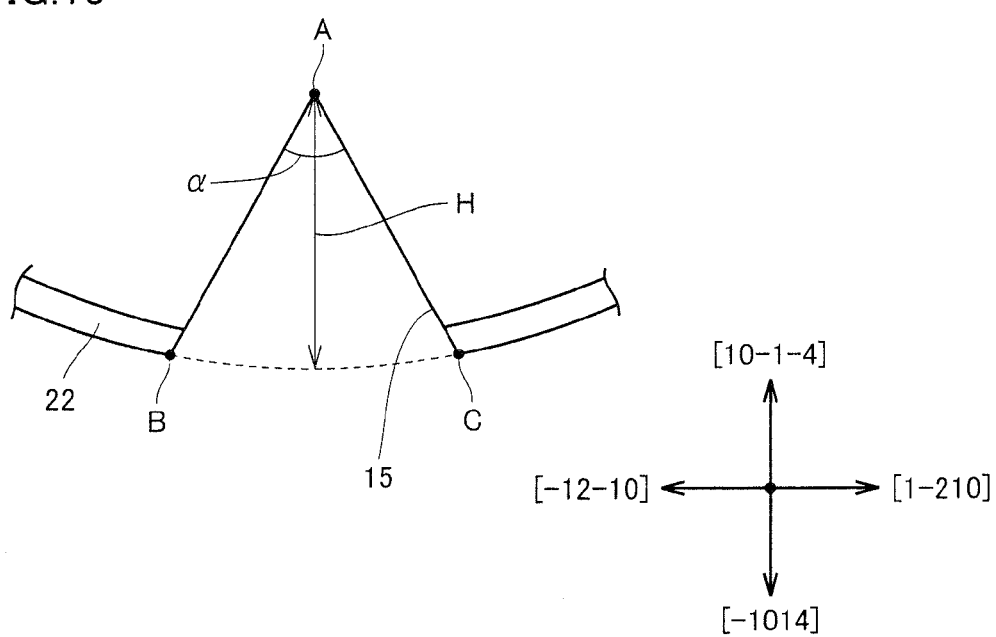
FIG. 15 is an enlarged schematic diagram of a region R shown in FIG. 14.

Referring to FIGS. 14 and 15, another modification of the nitride semiconductor substrate shown in FIGS. 1 and 2 will be hereinafter described. A nitride semiconductor substrate 10c shown in FIGS. 14 and 15 is basically similar in configuration to nitride semiconductor substrate 10a shown in FIGS. 1 and 2, but is different in that it includes a notch 15 as an indicator.

Notch 15 is a cutout portion provided at the outer periphery of nitride semiconductor substrate 10c. As shown in FIGS. 14 and 15, notch 15 is provided in order to specify the (−1017) plane, the (−1017) plane, or the plane inclined at an angle of −0.5° or more and 0.5° or less from these planes. Specifically, as shown in FIG. 15, when three points A, B and C are positioned in notch 15, the direction extending from the intermediate point between points B and C to point A corresponds to the [−1014] direction or the [10-1-4] direction.

As shown in FIG. 15, a depth H of notch 15 is, for example, 2 mm or more and 10 mm or less, and an angle α is 30° or more and 120° or less. In the case where depth H is 10 mm or less and angle α is 120° or less, the area of main surface 11 of nitride semiconductor substrate 10c can be prevented from being reduced. In the case where depth H is 2 mm or more and angle α is 30° or more, notch 15 can readily be identified.

The method for manufacturing nitride semiconductor substrate 10c shown in FIGS. 14 and 15 is basically similar in configuration to the method for manufacturing nitride semiconductor substrate 10a shown in FIGS. 1 and 2, but is different in that notch 15 is provided in place of orientation flat 12. The method for providing notch 15 is not particularly limited, but notch 15 can be provided by cutting, grinding, polishing, and the like.

Figure 16:
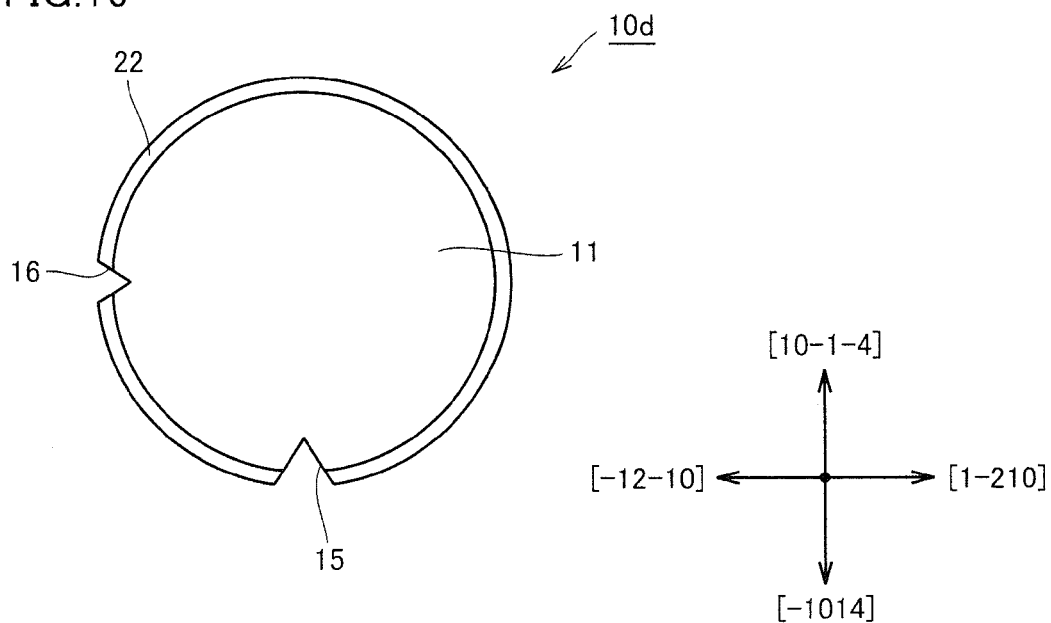
FIGS. 16 and 17 are schematic plan views each illustrating another modification of the nitride semiconductor substrate shown in FIGS. 1 and 2.

Referring to FIG. 16, another modification of the nitride semiconductor substrate shown in FIGS. 1 and 2 will be hereinafter described.

A nitride semiconductor substrate 10d shown in FIG. 16 is basically similar in structure to nitride semiconductor substrate 10c shown in FIGS. 14 and 15, but is different from nitride semiconductor substrate 10c shown in FIGS. 14 and 15 in that a second notch 16 is provided.

Second notch 16 is provided in order to provide an indication of an orientation and to distinguish between the topside surface and the backside surface. The direction of second notch 16 is approximately orthogonal to the direction of notch 15. Second notch 16 serves to indicate the (11-20) plane or the plane inclined at an angle of −0.5° or more and 0.5° or less from this plane, and more preferably, serves to indicate the (11-20) plane.

It is preferable that notch 15 and second notch 16 can be distinguished from each other in that notch 15 corresponds to a main notch and second notch 16 corresponds to a sub-notch. For example, notch 15 may be greater than second notch 16 for the purpose of distinguishing them from each other.

The method for manufacturing nitride semiconductor substrate 10d shown in FIG. 16 is basically similar in configuration to the method for manufacturing nitride semiconductor substrate 10c shown in FIGS. 14 and 15, but is different in that second notch 16 is further provided.

Figure 17:
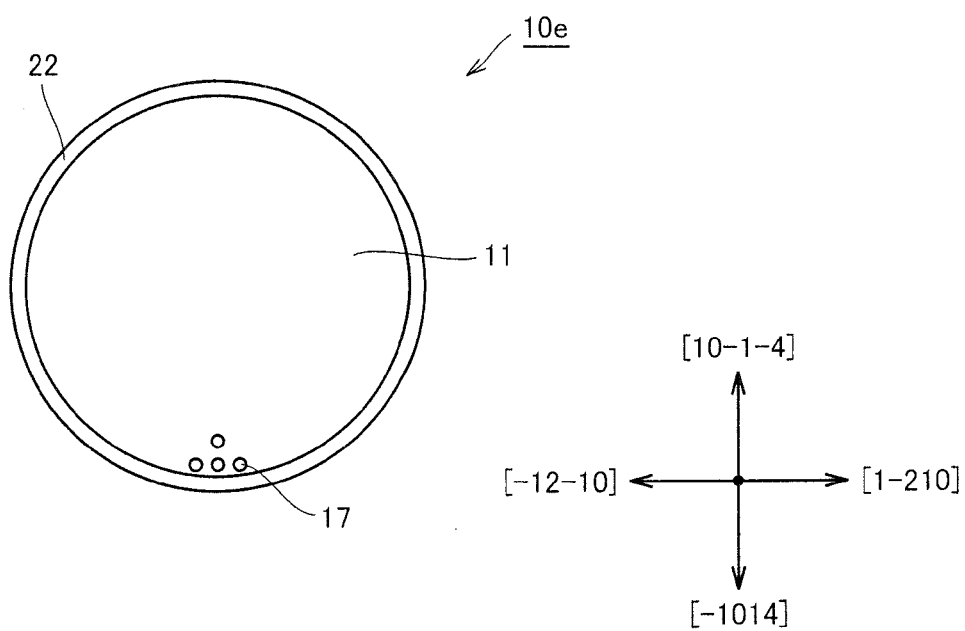

Referring to FIG. 17, another modification of the nitride semiconductor substrate shown in FIGS. 1 and 2 will be hereinafter described. A nitride semiconductor substrate 10e shown in FIG. 17 is basically similar in configuration to nitride semiconductor substrate 10a shown in FIGS. 1 and 2, but is different in that a mark 17 is provided as an indicator.

Mark 17 is provided, for example, by application of a laser beam or by scratching by a diamond pen. Mark 17 is provided such that the (−1017) plane, the (10-1-7) plane, or the plane inclined at an angle of −0.5° or more and 0.5° or less from these planes can be specified. For example, a plurality of marks 17 are provided in parallel with the [10-1-4] direction, the [−1014] direction or the direction inclined at an angle of −0.5° or more and 0.5° or less from these directions.

Furthermore, it is preferable that mark 17 is provided so as to allow the (11-20) plane or the plane inclined at an angle of −0.5° or more and 0.5° or less from this plane to be specified. For example, mark 17 in the [−1014] or [10-1-4] direction is provided to vary in size, number and the like from mark 17 in the [11-20] direction. In nitride semiconductor substrate 10e shown in FIG. 17, the number of marks 17 is greater in the [11-20] direction than in the [−1014] direction. Consequently, the [−1014] direction and the [11-20] direction can be identified.

Although marks 17 are provided in one place as a plurality of dots in FIG. 17, marks 17 may be provided in two or more regions, a single mark 17 may be provided, and mark 17 may have a shape other than a dot.

It is preferable that mark 17 is provided in the plane on the side opposite to the plane used for epitaxial growth in nitride semiconductor substrate 10e. Even in the case where mark 17 is provided in the backside surface and an impermeable metal film and the like are formed, since the nitride semiconductor has light transmissivity, its main surface is subjected to the polishing process to thereby allow mark 17 provided in the backside surface to be readily recognized.

The method for manufacturing nitride semiconductor substrate 10e according to the present embodiment is basically similar in configuration to nitride semiconductor substrate 10a shown in FIGS. 1 and 2, but is different in that mark 17 is provided in place of orientation flat 12.

Although the method for providing mark 17 is not particularly limited, for example, the method for providing a laser beam irradiation mark by applying a laser beam or the method for providing a mark made by scratching by a diamond pen may be employed. Consequently, mark 17 can readily be provided. Mark 17 can also be provided with an improved processing accuracy.

Although orientation flat 12, notch 15 and mark 17 have been described by way of an example of an indicator with regard to the above-described nitride semiconductor substrates 10a-10e, the indicator of the nitride semiconductor substrate of the present invention is not particularly limited thereto. Furthermore, the nitride semiconductor substrate of the present invention may include an orientation flat, a notch, a mark, and the like in combination.

Second Embodiment

Figure 18:
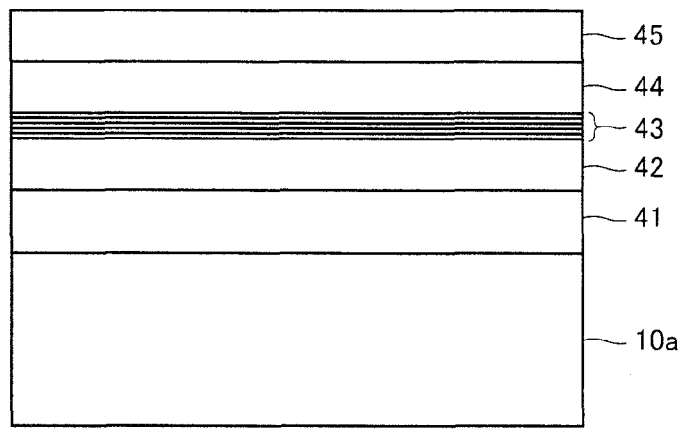
FIG. 18 is a schematic cross-sectional view of a light emitting element serving as a semiconductor device fabricated using the nitride semiconductor substrate according to the present invention.
Figure 19:
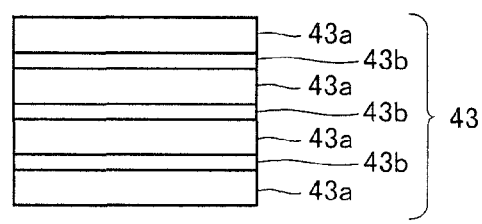
FIG. 19 is a schematic cross-sectional view illustrating a light emitting layer of the light emitting element shown in FIG. 18.

Referring to FIGS. 18 and 19, a light emitting element fabricated using the nitride semiconductor substrate according to the present invention will then be described.

Referring to FIG. 18, the light emitting element includes a nitride semiconductor substrate 10a corresponding to a GaN substrate of n-type conductivity, an n-type GaN layer 41, an AlGaN layer 42 formed on n-type GaN layer 41, a light emitting layer 43 formed on AlGaN layer 42, a p-type AlGaN layer 44 formed on light emitting layer 43, and a p-type GaN layer 45 formed on p-type AlGaN layer 44. Nitride semiconductor substrate 10a which is an n-type GaN substrate exhibits characteristics, for example, having a resistance value of $1\times10^{-2}$ Ωcm and a concentration of the n-type conductive impurities of $3\times10^{18}$/cm³. For example, n-type GaN layer 41 can be configured to have a thickness of 1 µm. Furthermore, silicon (Si) can be used as conductive impurities contained in this n-type GaN layer. For example, n-type AlGaN layer 42 can be configured to have a thickness of 150 nm. For example, silicon can be used as conductive impurities contained in this n-type AlGaN layer 42. AlGaN layer 42 may have composition of $Al_{0.1}Ga_{0.9}N$, for example.

Furthermore, a multiple quantum well structure, for example, as shown in FIG. 19 can be used as light emitting layer 43. Specifically, light emitting layer 43 may have a multilayer structure obtained by alternately laminating GaN layer 43a and GaInN layer 43b. In this case, for example, GaN layer 43a and GaInN layer 43b may be configured to have thicknesses of 10 nm and 3 nm, respectively. Furthermore, for example, $Ga_{0.85}In_{0.15}N$ can be used as composition of the GaInN layer.

P-type AlGaN layer 44 located on this light emitting layer 43 can be configured to have a thickness of 20 nm. Furthermore, magnesium (Mg) can be used as conductive impurities contained in this p-type AlGaN layer. For example, $Al_{0.2}Ga_{0.8}N$ can be used as composition of this p-type AlGaN layer 44.

Furthermore, p-type GaN layer 45 can be configured to have a thickness of 150 nm. Also, magnesium can be used as conductive impurities contained in this p-type GaN layer 45.

The semiconductor element shown in FIGS. 18 and 19 can be formed by carrying out the steps of preparing one of nitride semiconductor substrates 10a-10e according to the present invention by using the method for manufacturing the substrate shown in FIG. 4, and then, epitaxially growing a predetermined film on main surface 11 of one of nitride semiconductor substrates 10a-10e.

Figure 20:
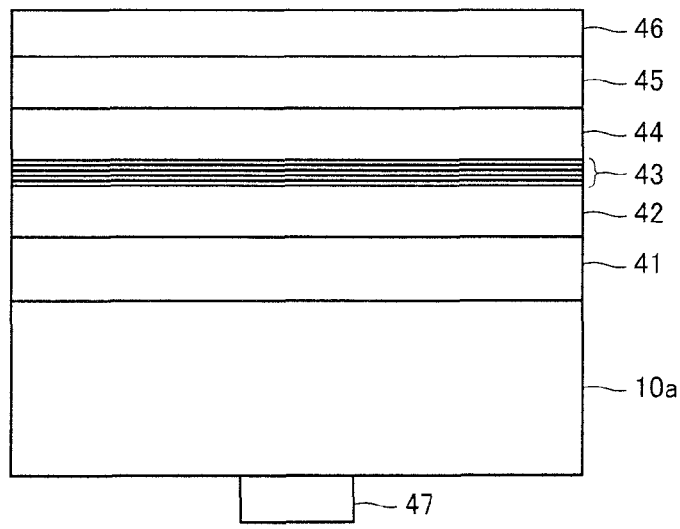
FIG. 20 is a cross-sectional schematic diagram showing the configuration having an electrode formed in the light emitting element shown in FIGS. 18 and 19.

Then, as shown in FIG. 20, an electrode is formed on the topside surface and the backside surface of the semiconductor element shown in FIGS. 18 and 19. Specifically, referring to FIG. 20, a p-side electrode 46 is formed on p-type GaN layer 45. For example, the electrode having a laminated structure of nickel (Ni) and gold (Au) can be used as this p-side electrode 46. Furthermore, on the surface of nitride semiconductor substrate 10a made of n-type GaN, an electrode having a laminated structure made of titanium (Ti)/aluminum (Al)/titanium (Ti)/gold (Au) can be used as an n-side electrode 47, as shown in FIG. 20. N-side electrode 47 is located approximately in the center of the surface of nitride semiconductor substrate 10a. P-side electrode 46 is formed so as to cover the surface of p-type GaN layer 45.

Figure 21:
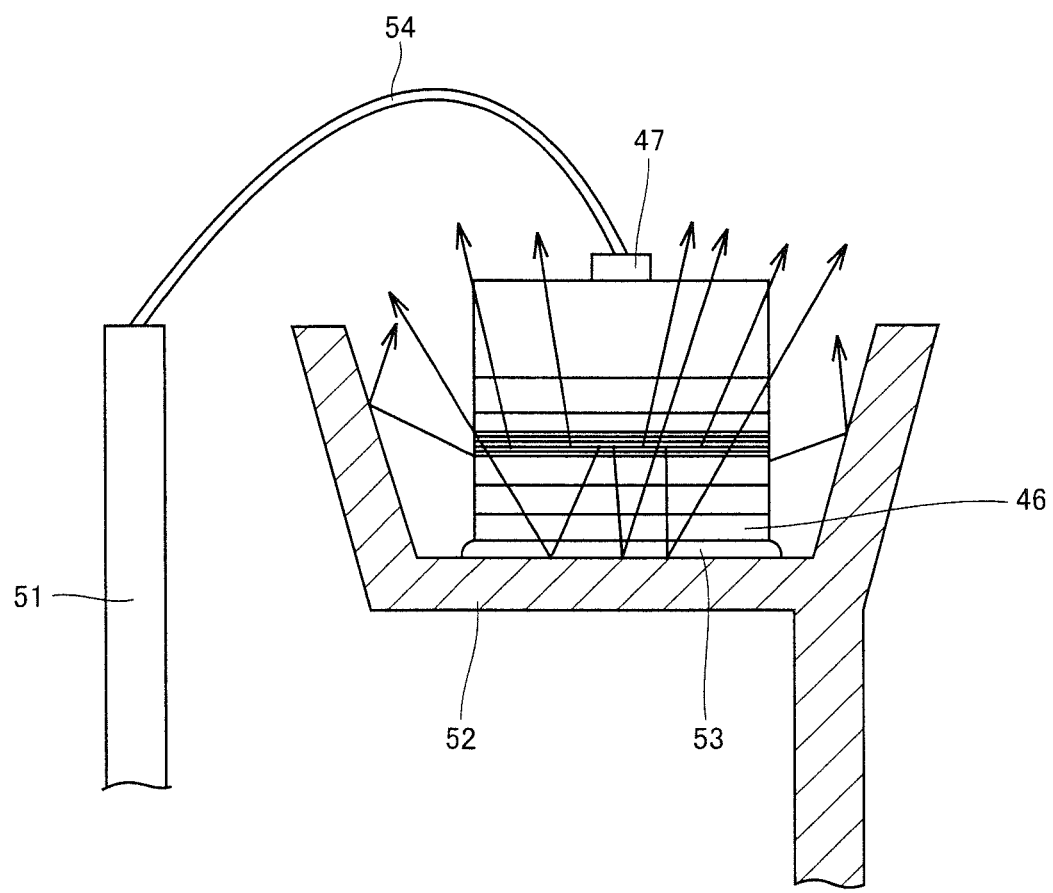
FIG. 21 is a schematic diagram showing a light emitting device fabricated using the light emitting element shown in FIG. 20.

Then, the light emitting element fabricated in this way is attached to a stem as shown in FIG. 21 to allow formation of a light emitting device. Referring to FIG. 21, p-side electrode 46 of the light emitting element shown in FIG. 20 is fixedly connected to a stem 52 by solder 53. On the other hand, n-side electrode 47 is electrically connected to a lead pin 51 through a wire 54. Thus, since the light emitting element mounted on stem 52 in the epi-down configuration (configuration in which the epitaxial layer side formed on nitride semiconductor substrate 10a is connected toward stem 52) has a transparent n-type GaN substrate corresponding to nitride semiconductor substrate 10a (see FIG. 20), light can be emitted also from this substrate side to the outside. Furthermore, since light emitting layer 43 is positioned in the vicinity of stem 52, the heat generated from the light emitting layer is readily transmitted to stem 52, which improves the heat dissipation performance. It is to be noted that the GaN substrate also has a high heat conductivity, which causes heat to be dissipated also from the substrate side.

The light emitting element can be configured to have a light emission wavelength of 430 nm to 550 nm. The light emission wavelength can be adjusted by the In composition of the light emitting layer. According to the nitride semiconductor substrate of the present invention, the efficiency of taking in of $1n$ during the epitaxial growth can be improved, and thus, an excellent light emitting property can be achieved at a light emission wavelength of 500 nm to 550 nm in the green region.

A characteristic configuration of the present invention will be hereinafter described, though partially overlapping the above-described embodiments.

Nitride semiconductor substrates 10a-10e according to the present invention includes main surface 11 inclined at an angle of 71° or more and 79° or less with respect to the (0001) plane toward the [1-100] direction or inclined at an angle of 71° or more and 79° or less with respect to the (000-1) plane toward the [-1100] direction; and a chamfered portion located at the edge of the outer periphery of main surface 11. The chamfered portion is inclined at an angle ($\theta 1$ or $\theta 2$) of 5° or more and 45° or less with respect to one, which is adjacent to the chamfered portion, of main surface 11 and backside surface 21 on the side opposite to main surface 11.

Nitride semiconductor substrates 10a-10e according to the present invention each have main surface 11 which allows the yield to be improved at the time when a semiconductor device is fabricated. In addition, cracking and chipping occurring from the edge of the outer periphery of nitride semiconductor substrates 10a-10e can be suppressed. Consequently, defects occurring in nitride semiconductor substrates 10a-10e resulting from the above-mentioned cracking and chipping can be suppressed, and the yield of nitride semiconductor substrates 10a-10e can also be improved.

It is to be noted that main surface 11 is inclined at an angle of 71° or more and 79° or less with respect to the (0001) plane toward the [1-100] direction or inclined at an angle of 71° or more and 79° or less with respect to the (000-1) plane toward the [-1100] direction as described above since the yield of the semiconductor device can be improved particularly in this angle range. Furthermore, the lower limit of inclination angle $\theta 1$ or $\theta 2$ of the chamfered portion is set at 5°. This is because, when the angle is smaller than this lower limit, the resultant angular portion at the edge of the outer periphery of the substrate is almost the same as that obtained in the case where no chamfered portion is substantially formed, with the result that no effect of suppressing cracking and chipping can be achieved. In addition, the upper limit of the inclination angle is set at 45°. This is because, when the angle is greater than this upper limit, the resultant angular portion of the interface between the chamfered portion and the main surface shows an angle smaller than 135°, which produces a problem of cracking and chipping in this angular portion.

It is to be noted that the inclination angle of the chamfered portion as described above is preferably 15° or more and 35° or less, and more preferably, 17° or more and 25° or less. The reason why the value range is set as described above is that it can increase the probability of preventing cracking, fracturing and chipping occurring in the subsequent steps (the topside surface grinding and backside surface grinding steps).

In the above-described nitride semiconductor substrates 10a-10e, main surface 11 may be inclined at an angle of −0.5° or more and 0.5° or less from the (20-21) plane or the (−202-1) plane. In this case, each of nitride semiconductor substrates 10a-10e having the above-mentioned plane as main surface 11 is used to fabricate a semiconductor device, which allows its characteristics to be particularly improved.

In the above-described nitride semiconductor substrates 10a-10e, a damaged layer 25 having an average thickness of 0.5 µm or more and 10 µm or less may be formed on the surface layer of the chamfered portion.

In this case, damaged layer 25 is formed at the edge of the outer periphery of each of nitride semiconductor substrates 10a-10e to thereby allow the region having remaining stress to be provided at the edge of the outer periphery. Consequently, the effects of reducing defects in shape such as warpage of nitride semiconductor substrates 10a-10e can be achieved by adjusting the thickness of damaged layer 25 as appropriate.

It is to be noted that the average thickness of damaged layer 25 can be measured by a TEM (transmission electron microscope). The lower limit of the average thickness is set at 0.5 µm since, when forming a chamfered portion by polishing and grinding, the damaged layer having a thickness less than 0.5 µm causes reduction in effects of suppressing warpage, which leads to a decrease in the yield of the device. Furthermore, the upper limit of the average thickness is set at 10 µm since the damaged layer formed to have a thickness greater than 10 µm causes an increase in probability of occurrence of cracking and fracturing, which leads to a further decrease in the yield of the device.

It is to be noted that the average thickness of damaged layer 25 is preferably 1 µm or more and 5 µm or less. The reason why the value range is set as described above is that the grindstone of a large grain size is used in the process where the average thickness is 1 µm or less, which increases the processing time to cause an increase in manufacturing costs, and that the grindstone of a small grain size (coarser) is used in the process where the average thickness is 5 µm or more, which causes a decrease in the yield of the device due to problems such as generation of particles.

In the above-described nitride semiconductor substrates 10a-10e, the chamfering amount of the chamfered portion (widths L1 and L2 in FIG. 2) may be 0.02 mm or more and 0.5 mm or less. In this case, the effects of suppressing cracking and chipping occurring from the edge of the outer periphery of each of nitride semiconductor substrates 10a-10e can be reliably achieved.

In addition, the lower limit of the chamfering amount is set at 0.02 mm. This is because, when the value is smaller than this lower limit, the resultant angular portion at the edge of the outer periphery of the substrate is almost the same as that obtained in the case where no chamfered portion is substantially formed, with the result that no effect of suppressing cracking and chipping can be achieved. Furthermore, the upper limit of the chamfering amount is set at 0.5 mm. This is because, when the chamfering amount is greater than this upper limit, the area of the chamfered portion is excessively increased in the main surface of the substrate to thereby cause a decrease in the number of semiconductor devices obtained from the substrate, which results in an increase in manufacturing costs of the semiconductor device.

It is to be noted that the above-described chamfering amount is preferably 0.05 mm or more and 0.3 mm or less, and more preferably, 0.05 mm or more and 0.2 mm or less. The reason why the value range is set as described above is that a greater chamfering amount (leading to an increase in the grinding amount) causes an increased load to be applied to the substrate during processing, which leads to an increase in the probability of occurrence of defects such as cracking and the like.

In the above-described nitride semiconductor substrates 10a-10e, the arithmetical mean roughness (Ra) in the topside surface of the chamfered portion may be 0.07 μm or more and 3 μm or less.

In this case, it can be possible to prevent problems from occurring (for example, generation of particles) due to excessive roughness of the surface of the chamfered portion. It is to be noted that the lower limit of the above-mentioned surface roughness is set at 0.07 μm in terms of Ra since it is difficult to reduce the surface roughness below this lower limit at reasonable costs. Furthermore, the upper limit of the above-mentioned surface roughness is set at 3 μm in terms of Ra since the value greater than this upper limit causes an increased probability of occurrence of problems such as generation of particles.

Furthermore, the above-mentioned surface roughness is, in terms of Ra, preferably 0.07 μm or more and 1 μm or less, and more preferably, 0.07 μm or more and 0.5 μm or less. The reason why the value range is set as described above is that the smaller the Ra is, the finer the particles (impurities) can be suppressed from occurring, which leads to an increase in the yield of the device element.

In the above-described nitride semiconductor substrates 10a-10e, main surface 11 may be subjected to mirror-surface processing. The surface roughness of main surface 11 may be 0.2 nm or more and 4 nm or less in terms of the root mean square roughness (RMS).

In this case, when an epitaxial film is formed on main surface 11, formation defects in the epitaxial film can be suppressed.

It is to be noted that the lower limit of the surface roughness of main surface 11 is set at the above-described values since it is difficult to set the surface roughness below the above-described values at industrially reasonable costs. Furthermore, the upper limit of the above-described surface roughness is set at the above-described values since the value greater than the above-described values causes an increased probability of occurrence of formation defects in the epitaxial film.

Furthermore, the above-described surface roughness of main surface 11 is preferably 1 nm or more and 3 nm or less in terms of RMS. The reason why the value range is set as described above is that this value range is preferable in terms of costs and quality as with the reasons described above.

An indicator (orientation flats 12 and 13, notches 15 and 16, mark 17) indicating a predetermined plane may be provided in the above-described nitride semiconductor substrates 10a-10e.

In this case, when nitride semiconductor substrates 10a-10e are treated or when nitride semiconductor substrates 10a-10e are used to manufacture a semiconductor device (see FIGS. 18-21), the plane orientation of each of nitride semiconductor substrates 10a-10e can be reliably recognized.

In the above-described nitride semiconductor substrates 10a-10e, the predetermined plane indicated by the indicator may be the (−1017) plane, the (10-1-7) plane, or the plane inclined at an angle of −0.5° or more and 0.5° or less from these planes, or may be the (11-20) plane or the plane inclined at an angle of −0.5° or more and 0.5° or less from this plane.

Nitride semiconductor substrates 10a-10e according to the present invention each have main surface 11 that allows the yield to be improved when a semiconductor device is fabricated. As a result of an earnest study to specify the plane orientation for the purpose of applying nitride semiconductor substrates 10a-10e each having main surface 11 to a semiconductor device, the inventors of the present invention found that the (−1017) plane and the (10-1-7) plane and their vicinities tend to readily cleave. Then, the inventors first revealed that the (−1017) plane, the (10-1-7) plane, or the plane inclined at an angle of −0.5° or more and 0.5° or less from these planes is identified by the indicator. This indicator allows the plane to be specified, which is readily cleaved when fabricating a semiconductor device using nitride semiconductor substrates 10a-10e each having this main surface 11. Accordingly, the crystal orientation can be aligned or distinguished by using the plane that is readily cleaved. Thus, a semiconductor device exhibiting improved characteristics can be fabricated by using nitride semiconductor substrates 10a-10e according to the present invention. Therefore, nitride semiconductor substrates 10a-10e according to the present invention can be used for a semiconductor device.

The method for manufacturing a nitride semiconductor substrate according to the present invention includes the step (S10) of preparing a nitride semiconductor substrate having a main surface inclined at an angle of 71° or more and 79° or less with respect to the (0001) plane toward the [1-100] direction or inclined at an angle of 71° or more and 79° or less with respect to the (000-1) plane toward the [−1100] direction; and the step (S20) of chamfering the edge of the outer periphery of the main surface of the nitride semiconductor substrate. The step (S20) of chamfering the edge includes the step of forming a chamfered portion inclined at an angle ($\theta 1$ or $\theta 2$) of 5° or more and 45° or less with respect to one, which is adjacent to the chamfered portion, of main surface 11 and backside surface 21 on the side opposite to main surface 11. In this way, nitride semiconductor substrates 10a-10e according to the present invention can be manufactured.

The semiconductor device according to the present invention is fabricated using each of the above-described nitride semiconductor substrates 10a-10e, as shown in FIGS. 18-21. In this case, since cracking and chipping occurring in nitride semiconductor substrates 10a-10e can be effectively suppressed, a semiconductor device exhibiting a high manufacturing yield can be implemented.

The method for manufacturing a semiconductor device according to the present invention includes the steps of preparing nitride semiconductor substrates 10a-10e using the method for manufacturing the above-described nitride semiconductor substrate as shown in FIG. 4; and forming an epitaxial layer on main surface 11 of each of nitride semiconductor substrates 10a-10e. In this case, since cracking and chipping occurring in nitride semiconductor substrates 10a-10e are effectively suppressed, a semiconductor device exhibiting a high manufacturing yield can be implemented.

Example 1

In this example, the usability of the GaN substrate cut out from the (0001) GaN ingot in the [1-100] direction at an angle $\theta$ in the range between 68° and 82° was examined (Test 1). Specifically, the substrate with an angle different from angle $\theta$ was used to form an element of a semiconductor laser device and measure the oscillation yield of the element. Furthermore, an examination was made with regard to the effects of the inclination angle ($\theta 1$ or $\theta 2$) of the chamfered portion with respect to adjacent one of main surface 11 and backside surface 21 on the side opposite to main surface 11 (Test 2).

(Test 1)
Preparation of Sample

First, the (0001) GaN ingot thickly grown by the HVPE method was cut at an angle θ in the range between 68° and 82° in the [1-100] direction using a wafer slicing apparatus to fabricate a GaN substrate (sample IDs in Table 1 set forth below: I-1 to I-9) in which an inclination angle θ formed between the [0001] direction and the [1-100] direction has a desired off angle in the range between 68° and 82°. For example, when the ingot was cut at angle θ of 75°, a GaN substrate having the (20-21) plane as a main surface was obtained. This main surface corresponds to main surface 11 in the hexagonal crystal lattice in FIG. 3.

In the GaN substrate, a chamfered portion was formed at its edge of the outer periphery. In addition, when a resin bond grindstone is used for chamfering processing, fracturing or cracking may occur from the outer periphery of the GaN substrate. Thus, in the present example, a rubber grindstone was used for processing in order to prevent fracturing and cracking. Specifically, the outer periphery was ground using a grindstone in which a mixture of 40 wt % of diamond abrasive grains having a grain size of #1000 and 60 wt % of $Fe_2O_3$ abrasive grains was fixed to the base with CR (chloroprene rubber). In this case, the arithmetical mean roughness (Ra) of the topside surface was 0.1 μm. The rubber grindstone has a porosity of 0% and has a thickness equal to that of the substrate. The shape of the chamfered portion (chamfer shape) was formed based on the shape shown in FIG. 11 in which the shapes on the topside and the backside were symmetrical to each other. The angle of the chamfer (chamfered angle) was uniformly set at 20°, and the chamfering amount was uniformly set at 0.2 mm. It is to be noted that when the substrate thickness, the chamfered angle of the topside and backside surfaces, and the chamfering amount are determined, the remaining length is also determined, and accordingly, the chamfers can be connected to each other by a smooth curved surface.

Furthermore, an orientation flat corresponding to the (-1017) plane was formed in this GaN substrate.

Figure 22:
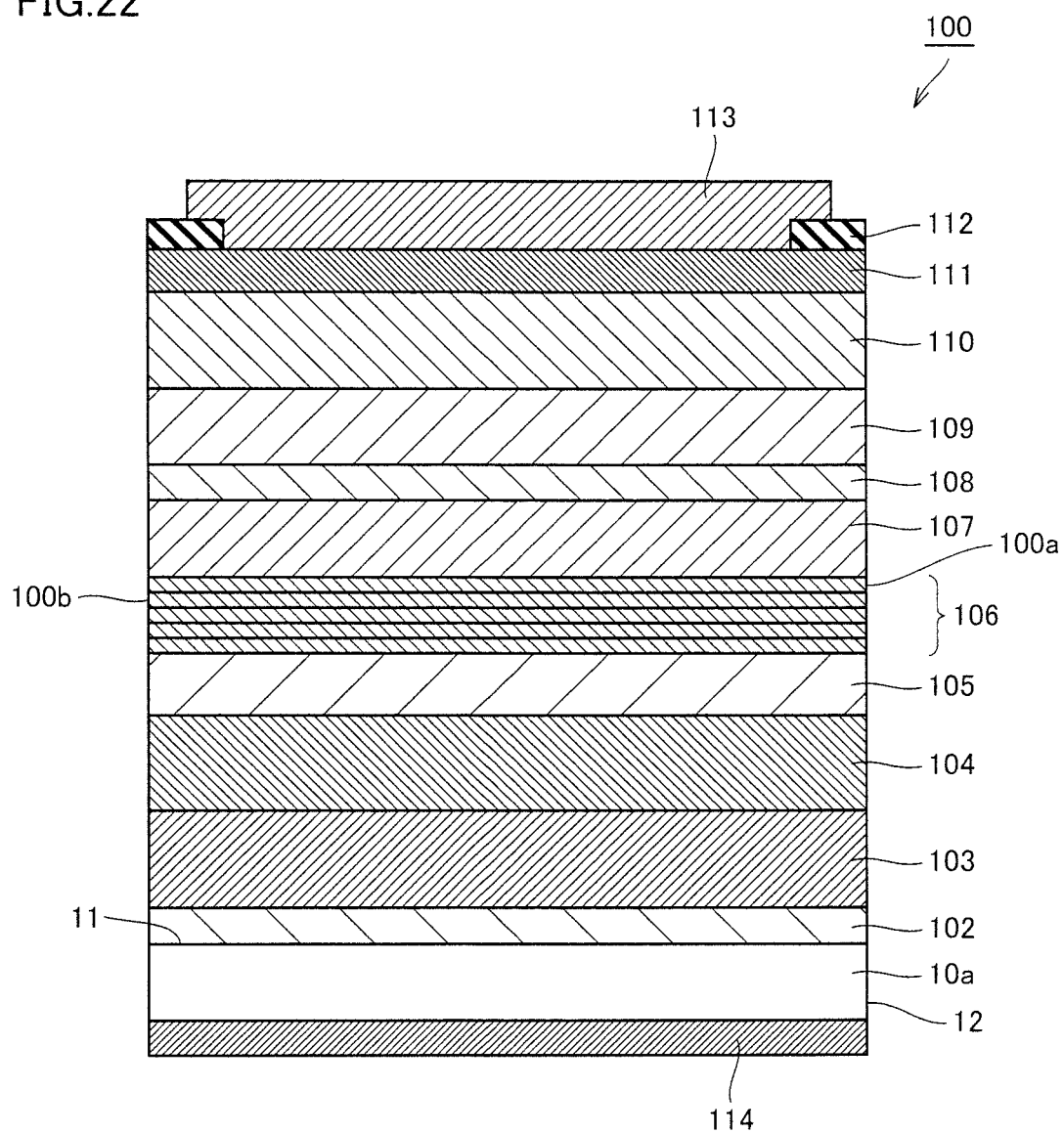
FIG. 22 is a cross-sectional view schematically showing a semiconductor laser device fabricated in Example 1.

Then, the GaN substrate was used to form a semiconductor laser device by the metal organic chemical vapor deposition method. A resultant semiconductor laser device 100 has a configuration shown in FIGS. 22 and 23. Furthermore, the materials used in the metal organic chemical vapor deposition method include trimethyl gallium (TMGa), trimethyl aluminum (TMAl), trimethyl indium (TMIn), ammonia ($NH_3$), and silane ($SiH_4$).

Specifically, after the GaN substrate was placed as nitride semiconductor substrate 10a on the susceptor in the reactor, an epitaxial layer was grown in the following growth process. First, referring to FIG. 22, n-type GaN having a thickness of 1000 nm was grown as an n-type buffer layer 102 on the main surface of nitride semiconductor substrate 10a (GaN substrate). Then, an n-type InAlGaN cladding layer having a thickness of 1200 nm was grown as an n-type cladding layer 103. Then, an n-type GaN guide layer having a thickness of 200 nm as an n-type guide layer 104 and an undoped InGaN guide layer having a thickness of 65 nm as an undoped guide layer 105 were grown. Then, a 3-cycle MQW structure made of GaN having a thickness of 15 nm and InGaN having a thickness of 3 nm was grown as an active layer 106. Then, an undoped InGaN guide layer having a thickness of 65 nm as an undoped guide layer 107, a p-type AlGaN block layer having a thickness of 20 nm as a p-type block layer 108, and a p-type GaN guide layer having a thickness of 200 nm as a p-type guide layer 109 were grown. Then, a p-type InAlGaN cladding layer having a thickness of 400 nm was grown as a p-type cladding layer 110. Finally, a p-type GaN contact layer having a thickness of 50 nm was grown as a p-type contact layer 111.

Then, after forming an insulation film 112 made of $SiO_2$ on p-type contact layer 111, the photolithography method was used to provide a stripe window having a width of 10 μm in insulation film 112 by wet etching. In this case, since the [-1014] direction can be specified in the above-described epitaxial layer by orientation flat 12, the direction of the laser stripe was inclined at an angle of −0.5° or more and 0.5° or less from the [−1014] direction, as shown in FIG. 23.

Figure 23:
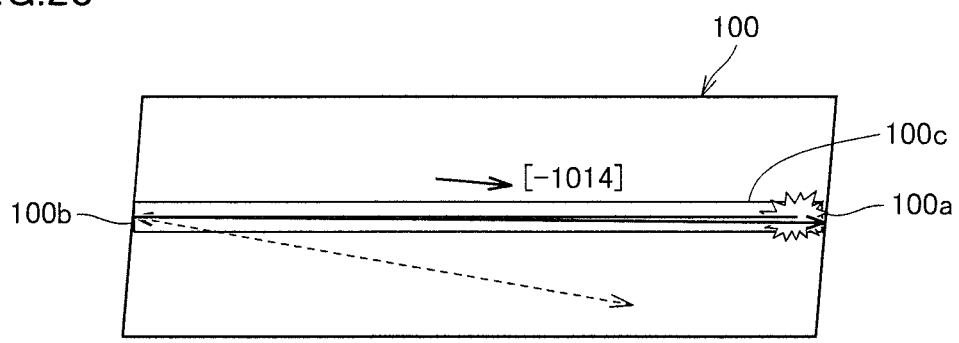
FIG. 23 is a schematic diagram showing the position of a waveguide in the semiconductor laser device shown in FIG. 21 as seen from above.

Since an opening (stripe window) of insulation film 112 is provided in the above-described direction, the orientation of a waveguide 100c of semiconductor laser device 100 is in the [−1014] direction or is inclined at an angle of −4° or more and 4° or less with respect to this direction toward the [1-100] direction, and is inclined at an angle of −0.5° or more and 0.5° or less in the direction orthogonal to the [1-100] direction, as shown in FIG. 23. In other words, waveguide 100c is formed in the direction approximately vertical to end faces 100a and 100b (the (−1017) plane, the (10-1-7) plane, or the plane inclined at an angle of −4° or more and 4° or less with respect to these planes toward the [1-100] direction and inclined at an angle of −0.5° or more and 0.5° or less in the direction orthogonal to the [1-100] direction).

Then, after providing the stripe window, a p-type electrode 113 made of Ni/Au and a pad electrode (not shown) made of Ti/Al were vapor-deposited. Then, by using the diamond slurry, the backside surface of the GaN substrate (nitride semiconductor substrate 10a) was ground to achieve a substrate thickness of 100 μm or less which facilitates cleavage, and fabricate a substrate product having a backside surface in the mirror state. On the backside surface (polishing surface) of the GaN substrate, an n-type electrode 114 made of Ti/Al/Ti/Au was formed by vapor deposition.

A resonator mirror for this laser stripe was fabricated using a laser scriber employing a YAG laser beam having a wavelength of 355 nm. When the laser scriber is used for cutting, the oscillation chip yield can be improved as compared to the case where the diamond scribe method is used. A scribe groove was formed on the conditions that the laser light output was set at 100 mW and the scanning speed was set at 5 mm/s. For example, the resultant scribe groove had a length of 30 μm, a width of 10 μm and a depth of 40 μm. The scribe groove was formed by directly applying a laser light beam to the surface of the epitaxial layer at a pitch of 800 μm through an opening in the insulation film of the GaN substrate. The resonator length was set at 600 μm.

Figure 24:
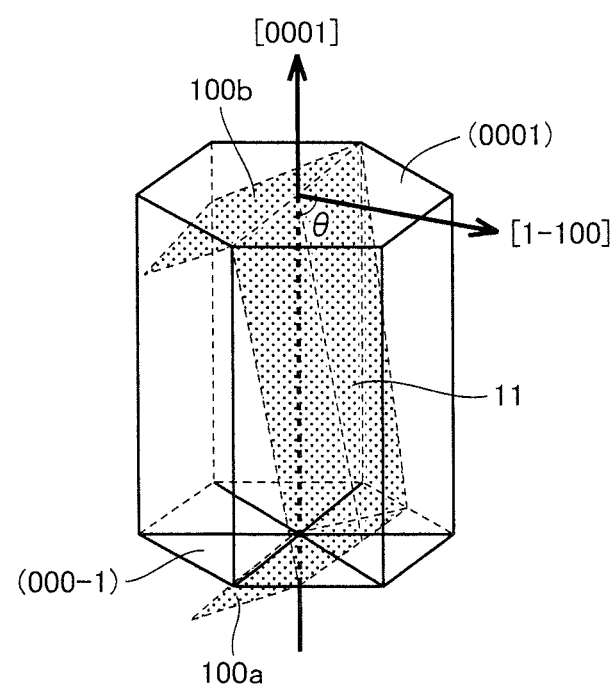
FIG. 24 is a diagram schematically showing the crystal orientation in each of the end face of the semiconductor laser device shown in FIG. 21 and the main surface of the nitride semiconductor substrate.

A resonator mirror was fabricated by cutting using a blade. The blade was pressed against the underside of the GaN substrate to cut the substrate product, thereby fabricating a laser bar. More specifically, as shown in FIG. 24, end faces 100a and 100b for a laser resonator correspond to the (−1017) plane and the (10-1-7) plane, respectively. Main surface 11, end faces 100a and 100b are different from the conventional cleavage plane such as the conventional c-plane, m-plane and a-plane, respectively.

As a result of observation, with a scanning electron microscope, of the plane provided by cutting, noticeable projections and depressions were not observed. Accordingly, it is presumed that the degree of flatness of the plane obtained by cutting (size of projections and depressions) is 20 nm or less. Furthermore, the vertical degree with respect to the sample surface of the above-described plane fell within a range of ±5°.

Then, the end face of the laser bar was coated with a dielectric multilayer film by the vacuum deposition method. The dielectric multilayer film was formed by alternately laminating $SiO_2$ (silicon oxide) and $TiO_2$ (titanium dioxide). The film thickness was adjusted to fall within a range of 50 nm or more and 100 nm or less, to design the center wavelength of the reflectivity to fall within a range of 500 nm or more and 530 nm or less. On one side, the reflecting plane was set to 10 cycles and the design value of the reflectivity was set at about 95%. On the other side, the reflecting plane was set to 6 cycles and the design value of the reflectivity was set at about 80%.

FIG. 11 in which the shapes on the topside and the backside were symmetrical to each other. The chamfering amount was uniformly set at 0.2 mm.

Test and Results

With regard to the samples of the GaN substrate fabricated as described above, the substrate yield was calculated by visually observing the situation in which defects such as cracking, fracturing and chipping occur. Furthermore, with regard to the semiconductor laser device fabricated using each sample of the GaN substrate, the oscillation yield (element yield) was measured in the same manner as in Test 1. The results are shown in Table 2.

TABLE 2

| ID | II-1 | II-2 | II-3 | II-4 | II-5 | II-6 | II-7 | II-8 | II-9 | II-10 | II-11 |
|---|---|---|---|---|---|---|---|---|---|---|---|
| Angle of Main Surface (°) | 75 | 75 | 75 | 75 | 75 | 75 | 75 | 71 | 71 | 79 | 79 |
| Angle of Chamfer (°) | 0 | 5 | 15 | 25 | 35 | 45 | 60 | 5 | 45 | 5 | 45 |
| Element Yield (%) | 85 | 84 | 83 | 84 | 85 | 84 | 83 | 51 | 50 | 52 | 51 |
| Substrate Yield (%) | 11 | 65 | 72 | 90 | 69 | 60 | 25 | 59 | 60 | 62 | 61 |

Test and Results

With regard to the semiconductor laser device fabricated as described above, the relationship between inclination angle θ of the main surface of the GaN substrate (angle of the main surface) with respect to the (0001) plane toward the [1-100] direction and the oscillation yield was examined. In the present example, the oscillation yield was defined as (the number of oscillation chips)/(the number of measurement chips). The results are shown in Table 1.

TABLE 1

| ID | I-1 | I-2 | I-3 | I-4 | I-5 | I-6 | I-7 | I-8 | I-9 |
|---|---|---|---|---|---|---|---|---|---|
| Angle of Main Surface (°) | 82 | 79 | 77 | 76 | 75 | 74 | 73 | 71 | 68 |
| Angle of Chamfer (°) | 20 | 20 | 20 | 20 | 20 | 20 | 20 | 20 | 20 |
| Element Yield (%) | 15 | 51 | 77 | 84 | 85 | 82 | 75 | 50 | 10 |

Table 1 shows that excellent results were obtained in that the oscillation yield was 50% or more when inclination angle θ of the GaN substrate formed between the direction and the [1-100] direction (the angle of the main surface described in Table 1) fell within a range of 71° or more and 79° or less.

(Test 2)

In Test 2, an experiment was made basically with regard to the substrate having the above-described inclination angle θ (the angle of the main surface) of 75°. Specifically, the element yield and the substrate yield were examined with the topside and backside surfaces at different angles. The substrate yield, which corresponds to the percentage by which the substrate suffers no cracking, fracturing and chipping, was defined as (the number of substrates suffering no cracking, fracturing and chipping observed by visual confirmation)/(the number of the measured substrates).

Preparation of Sample

Samples of the GaN substrate (sample IDs in Table 2 described below: II-1 to II-11) and samples of the semiconductor laser device were fabricated by the method basically similar to that used for fabricating the samples prepared in Test 1 as described above. However, as shown in Table 2 describe below, the angle of the main surface (inclination angle θ) was set at 75°, 71° or 79°. Furthermore, with regard to each sample, the chamfered angle of the chamfered portion was changed in the range of 0° to 60°, as shown in Table 2. In this case, the grindstone having a grain size of #1000 was used for chamfering. Furthermore, the substrate having the same thickness was used. The shape of the chamfered portion (chamfer shape) was formed based on the shape shown in As shown in Table 2, the excellent results were obtained in that the substrate yields was 50% or more when the chamfered angle was 5° or more and 45° or less. Furthermore, the similar results were obtained also when using the chamfered portion having the chamfering amount and the chamfered angle each different between the topside surface and the backside surface.

Furthermore, the similar results were obtained also when the angle of the main surface (inclination angle θ) fell within the range of 71° and 79°. Also with regard to the crystal grown by the flux method, the same results as those described above were obtained. Furthermore, the same results as those described above were obtained also when a plurality of GaN substrates were used for an underlying substrate to grow a single GaN crystal on the plurality of underlying substrates by the HVPE method.

Example 2

In the present example, under different processing conditions for the chamfered portion (chamfering processing conditions), the substrate having a damaged layer of a different thickness in the chamfered portion was used to examine the effects caused by the thickness of the damaged layer. Specifically, samples of the GaN substrate having a damaged layer of a different thickness in the chamfered portion were prepared. Then, a semiconductor laser device having the same structure as in Example 1 was fabricated using the GaN substrate, and the element yield was examined.

Preparation of Sample

Samples of the GaN substrate (sample IDs in Table 3 described below: III-1 to III-9) were fabricated basically by the same manufacturing method as that of the GaN substrate in Example 1. The thickness of the damaged layer was changed by adjusting the grain size and the like of the rubber grindstone used for chamfering processing. Furthermore, the GaN substrate was configured to have a main surface inclined at angle θ (angle of the main surface) of 75° or 73° with respect to the (0001) plane toward the [1-100] direction.

Then, the resultant GaN substrate was used to fabricate a semiconductor laser device as in Example 1. Furthermore, the substrate having the same thickness was used, and the shape of the chamfered portion (chamfer shape) was formed based on the shape shown in FIG. 11 in which the shapes on the topside and the backside were symmetrical to each other. The chamfered angle was uniformly set at 20° and the chamfering amount was uniformly set at 0.2 mm.

Test and Results

With regard to the manufactured semiconductor laser device, an oscillation experiment was conducted to examine the relationship between the thickness of the damaged layer in the chamfered portion (the average damaged layer thickness) and the oscillation yield (element yield). The results are shown in Table 3.

TABLE 3

| ID | III-1 | III-2 | III-3 | III-4 | III-5 | III-6 | III-7 | III-8 | III-9 |
|---|---|---|---|---|---|---|---|---|---|
| Angle of Main Surface (°) | 75 | 75 | 75 | 75 | 75 | 75 | 75 | 73 | 73 |
| Thickness of Damaged layer in Chamfer(μm) | 0.5 | 1 | 3 | 5 | 7 | 9 | 11 | 1 | 11 |
| Element Yield (%) | 50 | 85 | 86 | 84 | 53 | 51 | 13 | 73 | 11 |

As shown in Table 3, the excellent results were obtained in that the element yields was 50% or more when the average damaged layer thickness in the chamfer was 0.5 μm or more and 10 μm or less. Furthermore, the same results were obtained also when using the chamfered portion having the chamfering amount and the chamfered angle each different between the topside surface and the backside surface. Also with regard to the crystal grown by the flux method, the same results as those described above were obtained. Furthermore, the same results as those described above were obtained also when a plurality of GaN substrates were used for an underlying substrate to grow a single GaN crystal on the plurality of underlying substrates by the HVPE method.

Example 3

In the present example, under different processing conditions for the chamfered portion (chamfering processing condition), the substrate having a chamfered portion chamfered by a different amount was used to examine the effects caused by the chamfering amount. Specifically, samples of the GaN substrate having a chamfered portion chamfered by a different amount were prepared to examine the substrate yield.

Preparation of Sample

Samples of the GaN substrate (sample IDs in Table 4 described below: IV-1 to IV-9) were fabricated basically by the same manufacturing method as that of the GaN substrate in Example 1. Inclination angle θ of the main surface of the GaN substrate (angle of the main surface) with respect to the (0001) plane toward the [1-100] direction was set at 75° or 74°. In this case, the grindstone having a grain size of #1000 was used for chamfering. Furthermore, the substrate having the same thickness was used, and the shape of the chamfered portion (chamfer shape) was formed based on the shape shown in FIG. 11 in which the shapes on the topside and the backside were symmetrical to each other. The chamfered angle was uniformly set at 20°.

Test and Results

With regard to the samples of the GaN substrate fabricated as described above, the substrate yield was calculated by visually observing the situation in which defects such as cracking, fracturing and chipping occur. The results are shown in Table 4.

As shown in Table 4, the excellent results were obtained in that the substrate yields was 50% or more when the chamfering amount was 0.02 mm or more and 0.5 mm or less. Furthermore, the same results were obtained also when using the chamfered portion having the chamfering amount and the chamfered angle each different between the topside surface and the backside surface. Also with regard to the crystal grown by the flux method, the same results as those described above were obtained. Furthermore, the same results as those described above were obtained also when a plurality of GaN substrates were used for an underlying substrate to grow a single GaN crystal on the plurality of underlying substrates by the HVPE method.

Example 4

In the present example, under different processing conditions for the chamfered portion (chamfering processing condition), the substrate having a chamfered portion of a different surface roughness was used to examine the effects caused by the surface roughness. Specifically, samples of the GaN substrate having a chamfered portion of a different surface roughness were prepared. The GaN substrate was then used to fabricate a semiconductor laser device having the same structure as that in Example 1, to examine the element yield.

Preparation of Sample

Samples of the GaN substrate (sample IDs in Table 5 described below: V-1 to V-9) were fabricated basically by the same manufacturing method as that of the GaN substrate in Example 1. In addition, the arithmetic mean roughness (Ra) of the surface of the chamfered portion was changed by adjusting the grain size and the like of the rubber grindstone used for chamfering processing. Furthermore, the GaN substrate was configured to have a main surface inclined at angle θ (angle of the main surface) of 75° or 76° with respect to the (0001) plane toward the [1-100] direction. The substrate having the same thickness was used. The shape of the chamfered portion (chamfer shape) was formed based on the shape shown in FIG. 11 in which the shapes on the topside and the backside were symmetrical to each other. The chamfered angle was uniformly set at 20° and the chamfering amount was uniformly set at 0.2 mm.

Then, the resultant GaN substrate was used to fabricate a semiconductor laser device in the same manner as in Example 1.

Test and Results

With regard to the manufactured semiconductor laser device, an oscillation experiment was conducted to examine the relationship between the surface roughness of the chamfered portion (roughness of the chamfer) and the oscillation yield (element yield). The results are shown in Table 5.

TABLE 4

| ID | IV-1 | IV-2 | IV-3 | IV-4 | IV-5 | IV-6 | IV-7 | IV-8 | IV-9 |
|---|---|---|---|---|---|---|---|---|---|
| Angle of Main Surface (°) | 75 | 75 | 75 | 75 | 75 | 75 | 75 | 74 | 74 |
| Chamfering Amount (mm) | 0 | 0.02 | 0.05 | 0.1 | 0.2 | 0.5 | 0.6 | 0.1 | 0.6 |
| Substrate Yield (%) | 8 | 65 | 80 | 90 | 89 | 53 | 25 | 88 | 20 |

TABLE 5

| ID | V-1 | V-2 | V-3 | V-4 | V-5 | V-6 | V-7 | V-8 | V-9 |
| --- | --- | --- | --- | --- | --- | --- | --- | --- | --- |
| Angle of Main Surface (°) | 75 | 75 | 75 | 75 | 75 | 75 | 75 | 76 | 76 |
| Roughness of Chamfer Ra (μm) | 0.07 | 0.1 | 0.5 | 1 | 2 | 3 | 4 | 0.1 | 3 |
| Element Yield (%) | 91 | 88 | 86 | 62 | 55 | 52 | 12 | 90 | 51 |

As shown in Table 5, the excellent results were obtained in that the element yields was 50% or more when the surface roughness of the chamfered portion was 0.07 μm or more and 3 μm or less. Furthermore, the same results were obtained also when using the chamfered portion having the chamfering amount and the chamfered angle each different between the topside surface and the backside surface. Also with regard to the crystal grown by the flux method, the same results as those described above were obtained. Furthermore, the same results as those described above were obtained also when a plurality of GaN substrates were used for an underlying substrate to grow a single GaN crystal on the plurality of underlying substrates by the HVPE method.

The present invention is particularly advantageously applied to a nitride semiconductor substrate having a main surface serving as a semipolar plane and a semiconductor device fabricated using this nitride semiconductor substrate.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A nitride semiconductor substrate comprising:
    a main surface inclined at an angle of 71° or more and 79° or less with respect to a (0001) plane toward a [1-100] direction or inclined at an angle of 71° or more and 79° or less with respect to a (000-1) plane toward a [-1100] direction; and
    a chamfered portion located at an edge of an outer periphery of said main surface,
    said chamfered portion being inclined at an angle of 5° or more and 45° or less with respect to adjacent one of said main surface and a backside surface on a side opposite to said main surface,
    said chamfered portion includes a topside chamfer formed on the main surface side and a backside chamfer formed on the backside surface side, and
    a damaged layer formed in the topside chamfer has a thickness greater than that of a damaged layer formed in the backside chamfer.

2. The nitride semiconductor substrate according to claim 1, wherein a damaged layer having an average thickness of 0.5 μm or more and 10 μm or less is formed on a surface layer of said chamfered portion.

3. The nitride semiconductor substrate according to claim 1, wherein a chamfering amount of said chamfered portion is 0.02 mm or more and 0.5 mm or less.

4. The nitride semiconductor substrate according to claim 1, wherein a surface roughness of said chamfered portion is 0.07 μm or more and 3 μm or less in terms of Ra.

5. A semiconductor device fabricated using the nitride semiconductor substrate according to claim 1.

* * * * *